United States Patent
Ikeda et al.

(10) Patent No.: US 9,459,532 B2
(45) Date of Patent: Oct. 4, 2016

(54) RADIATION-SENSITIVE RESIN COMPOSITION, POLYMER AND COMPOUND

(71) Applicant: JSR CORPORATION, Tokyo (JP)

(72) Inventors: Norihiko Ikeda, Tokyo (JP); Shin-ichi Nakamura, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 13/853,254

(22) Filed: Mar. 29, 2013

(65) Prior Publication Data

US 2013/0216951 A1 Aug. 22, 2013

Related U.S. Application Data

(63) Continuation of application No. PCT/JP2011/072298, filed on Sep. 28, 2011.

(30) Foreign Application Priority Data

| Sep. 30, 2010 | (JP) | 2010-220482 |
| Oct. 7, 2010 | (JP) | 2010-227871 |
| Jan. 17, 2011 | (JP) | 2011-007348 |
| Sep. 20, 2011 | (JP) | PCT/JP2011/071400 |

(51) Int. Cl.

| G03F 7/004 | (2006.01) |
| C08F 224/00 | (2006.01) |
| G03F 7/039 | (2006.01) |
| C09D 133/04 | (2006.01) |
| C08F 220/18 | (2006.01) |
| G03F 7/20 | (2006.01) |

(52) U.S. Cl.
CPC ........... *G03F 7/0397* (2013.01); *C08F 220/18* (2013.01); *C08F 224/00* (2013.01); *C09D 133/04* (2013.01); *G03F 7/004* (2013.01); *G03F 7/2041* (2013.01); *C08L 2312/06* (2013.01)

(58) Field of Classification Search
CPC .................... G03F 7/0397; C08F 224/00
USPC ............... 430/270.1, 910; 526/207, 282, 270
See application file for complete search history.

(56) References Cited

U.S. PATENT DOCUMENTS

| 6,406,828 | B1 * | 6/2002 | Szmanda et al. ......... 430/270.1 |
| 6,599,677 | B2 * | 7/2003 | Szmanda et al. ......... 430/270.1 |
| 6,927,011 | B2 * | 8/2005 | Fujiwara et al. ......... 430/270.1 |
| 7,316,884 | B2 * | 1/2008 | Ansai et al. ............. 430/270.1 |
| 2002/0042016 | A1 | 4/2002 | Yoon et al. |
| 2002/0155379 | A1 | 10/2002 | Yoon et al. |
| 2003/0148214 | A1 * | 8/2003 | Fujiwara et al. ......... 430/270.1 |
| 2004/0248031 | A1 * | 12/2004 | Ansai et al. ............. 430/270.1 |
| 2005/0170278 | A1 * | 8/2005 | Szmanda et al. ......... 430/270.1 |
| 2006/0194141 | A1 * | 8/2006 | Hada et al. ............. 430/270.1 |
| 2008/0166091 | A1 * | 7/2008 | Aoyagi et al. ........... 385/100 |
| 2009/0264565 | A1 | 10/2009 | Fuji et al. |

FOREIGN PATENT DOCUMENTS

| CN | 1931858 A | 3/2007 |
| EP | 1600437 | 11/2005 |
| JP | 53-141262 A | 12/1978 |
| JP | 11-199410 A | 7/1999 |
| JP | 2002-082441 | 3/2002 |
| JP | 2002-308937 | 10/2002 |
| JP | 2004-149743 | 5/2004 |
| JP | 2006-227632 | 8/2006 |

(Continued)

OTHER PUBLICATIONS

International Search Report for corresponding International Application No. PCT/JP2011/072298, Jan. 10, 2012.

(Continued)

*Primary Examiner* — John S Chu
(74) *Attorney, Agent, or Firm* — Oblon, McClelland, Maier & Neustadt, L.L.P.

(57) ABSTRACT

A radiation-sensitive resin composition includes a polymer, an acid generating agent, and an organic solvent. The polymer includes a first structural unit derived from a compound represented by a formula (1), and a second structural unit derived from a compound represented by a formula (2). $R^1$ represents an organic group having a valency of (a+2) that represents a ring structure having 3 to 8 carbon atoms together with the carbon atom constituting a lactone ring. $R^2$ represents a fluorine atom, a hydroxyl group, an organic group having 1 to 20 carbon atoms or the like.

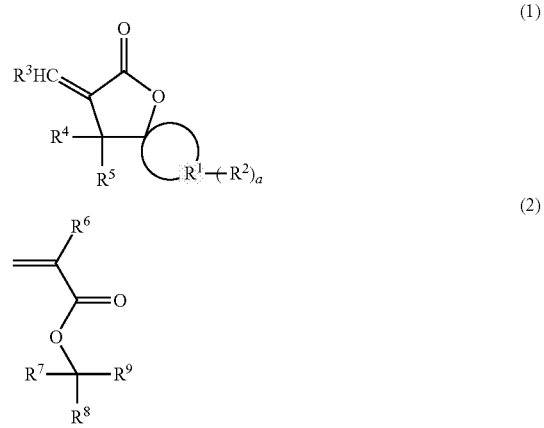

19 Claims, No Drawings

(56) References Cited

FOREIGN PATENT DOCUMENTS

| JP | 2007-131546 | 5/2007 |
|---|---|---|
| TW | 538056 B | 6/2003 |
| TW | I257032 B | 6/2006 |
| WO | WO 2005/069076 | 7/2005 |
| WO | WO 2006/035790 | 4/2006 |
| WO | WO 2006/075646 A1 | 7/2006 |
| WO | WO 2010/138820 | 12/2010 |
| WO | WO 2012/157352 | 11/2012 |

OTHER PUBLICATIONS

M. Alvarez et al., "Using the National Cancer Institute Anticancer Drug Screen to assess the effect of MRP expression on drug Sensitivity Profiles", Molecular Pharmacology, 1998, vol. 54, No. 5, pp. 802-814.
Extended European Search Report for corresponding EP Application No. 11829238.2-1301, Jan. 27, 2014.
Office Action issued Aug. 5, 2014 in Japanese Patent Application No. 2012-536530 (with English language translation).
Combined Chinese Office Action and Search Report issued Aug. 26, 2014 in Patent Application No. 201180047387.0 (with English language translation).
Combined Taiwanese Office Action and Search Report issued Apr. 30, 2015 in Patent Application No. 100135224 (with English language translation).
Office Action issued Aug. 25, 2015, in Japanese Patent Application No. 2014-203522 (with English translation).
Office Action issued May 18, 2015, in Chinese Patent Application No. 201180047387.0 filed Sep. 28, 2011 (w/ English translation).

* cited by examiner

RADIATION-SENSITIVE RESIN COMPOSITION, POLYMER AND COMPOUND

CROSS-REFERENCE TO RELATED APPLICATIONS

The present application is a continuation application of International Application No. PCT/JP2011/072298, filed Sep. 28, 2011, which claims priority to Japanese Patent Application No. 2010-220482, filed Sep. 30, 2010, to Japanese Patent Application No. 2010-227871, filed Oct. 7, 2010, to Japanese Patent Application No. 2011-007348, filed Jan. 17, 2011, and to International Application No. PCT/JP2011/071400, filed Sep. 20, 2011. The contents of these applications are incorporated herein by reference in their entirety.

BACKGROUND OF THE INVENTION

1. Field of the Invention

The present invention relates to a radiation-sensitive resin composition, a polymer and a compound.

2. Discussion of the Background

Chemically amplified radiation-sensitive resin compositions generate an acid upon irradiation with an electron beam or far ultraviolet ray typified by a KrF excimer laser or ArF excimer laser at a light-exposed site, and a chemical reaction that proceeds with the acid as a catalyst allows the difference in dissolution rates in developing solutions to be produced between the light-exposed site and the light-unexposed site, thereby enabling resist patterns to be formed on the substrate.

As lithography materials for an ArF excimer laser as a light source that enable microfabrication with light at shorter wavelengths, a resin composition containing a polymer having in the skeleton an alicyclic hydrocarbon that does not exhibit significant absorption in the area of 193 nm has been used. A polymer that includes a structural unit derived from a monomer having a spirolactone structure has been proposed as such a polymer (see Japanese Unexamined Patent Application, Publication Nos. 2002-82441 and 2002-308937). When a radiation-sensitive resin composition contains such a polymer obtained using a monomer having a spirolactone structure, development contrast is reportedly improved.

SUMMARY OF THE INVENTION

According to one aspect of the present invention, a radiation-sensitive resin composition includes a polymer, an acid generating agent, and an organic solvent. The polymer includes a first structural unit derived from a compound represented by a formula (1), and a second structural unit derived from a compound represented by a formula (2).

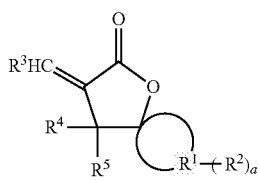

(1)

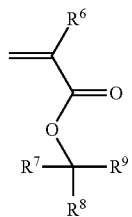

(2)

In the formula (1), $R^1$ represents an organic group having a valency of (a+2) that represents a ring structure having 3 to 8 carbon atoms together with the carbon atom constituting a lactone ring; $R^2$ represents a fluorine atom, a hydroxyl group or an organic group having 1 to 20 carbon atoms; a is an integer of 0 to 6, wherein in a case where a is 2 or greater, each of a plurality of $R^2$s is identical or different, wherein in a case where a is 2 or greater, each $R^2$ represents a fluorine atom, a hydroxyl group or an organic group having 1 to 20 carbon atoms, or at least two $R^2$s taken together represent a ring structure and $R^2$ other than the at least two $R^2$s represents a fluorine atom, a hydroxyl group or an organic group having 1 to 20 carbon atoms, and wherein at least one group of $R^1$ and $R^2$ has a hetero atom or a halogen atom; $R^3$ represents a hydrogen atom or a methyl group; $R^4$ represents a hydrogen atom, a fluorine atom, or an alkyl group having 1 to 6 carbon atoms; and $R^5$ represents a hydrogen atom, or $R^5$ and $R^4$ taken together represent a cycloalkanediyl group having 3 to 8 carbon atoms together with the carbon atom to which $R^5$ and $R^4$ bond. In the formula (2), $R^6$ represents a hydrogen atom or a methyl group; $R^7$, $R^8$ and $R^9$ each independently represent an alkyl group having 1 to 6 carbon atoms, or $R^7$ and $R^8$ taken together represent a ring structure together with the carbon atom to which $R^7$ and $R^8$ bond and $R^9$ represents an alkyl group having 1 to 6 carbon atoms, wherein a hydrogen atom of the alkyl group represented by $R^7$, $R^8$ or $R^9$ is not substituted or substituted.

According to another aspect of the present invention, a polymer includes a first structural unit derived from a compound represented by a formula (1), and a second structural unit derived from a compound represented by a formula (2).

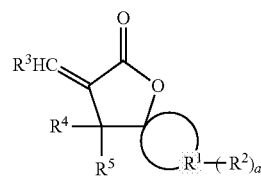

(1)

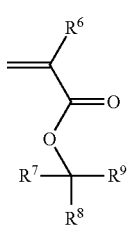

(2)

In the formula (1), $R^1$ represents an organic group having a valency of (a+2) that represents a ring structure having 3 to 8 carbon atoms taken together with the carbon atom constituting a lactone ring; $R^2$ represents a fluorine atom, a hydroxyl group or an organic group having 1 to 20 carbon atoms; a is an integer of 0 to 6, wherein in a case where a is 2 or greater, each of a plurality of $R^2$s is identical or different, wherein in a case where a is 2 or greater, each $R^2$ represents a fluorine atom, a hydroxyl group or an organic group having 1 to 20 carbon atoms, or at least two $R^2$s taken together represent and $R^2$ other than the at least two $R^2$s represents a fluorine atom, a hydroxyl group or an organic group having 1 to 20 carbon atoms, and wherein at least one group of $R^8$ and $R^2$ has a hetero atom or a halogen atom; $R^3$ represents a hydrogen atom or a methyl group; $R^4$ represents a hydrogen atom, a fluorine atom, or an alkyl group having 1 to 6 carbon atoms; and $R^5$ represents a hydrogen atom, or $R^5$ and $R^4$ taken together represent a cycloalkanediyl group having 3 to 8 carbon atoms together with the carbon atom to which $R^5$ and $R^4$ bond. In the formula (2), $R^6$ represents a hydrogen atom or a methyl group; $R^7$, $R^8$ and $R^9$ each independently represent an alkyl group having 1 to 6 carbon atoms, or $R^7$ and $R^8$ taken together represent a ring structure together with the carbon atom to which $R^7$ and $R^8$ bond and $R^9$ represents an alkyl group having 1 to 6 carbon atoms, wherein a hydrogen atom of the alkyl group represented by $R^7$, $R^8$ or $R^9$ is not substituted or substituted.

According to further aspect of the present invention, A compound is represented by a formula (1).

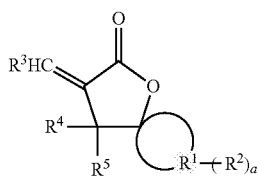

In the formula (1), $R^1$ represents an organic group having a valency of (a+2) that represents a ring structure having 3 to 8 carbon atoms taken together with the carbon atom constituting a lactone ring; $R^2$ represents a fluorine atom, a hydroxyl group or an organic group having 1 to 20 carbon atoms; a is an integer of 0 to 6, wherein in a case where a is 2 or greater, each of a plurality of $R^2$s is identical or different, wherein in a case where a is 2 or greater, each $R^2$ represents a fluorine atom, a hydroxyl group or an organic group having 1 to 20 carbon atoms, or at least two $R^2$s taken together represent a ring structure and $R^2$ other than the at least two $R^2$s represents a fluorine atom, a hydroxyl group or an organic group having 1 to 20 carbon atoms, and wherein at least one group of $R^1$ and $R^2$ has a hetero atom or a halogen atom; $R^3$ represents a hydrogen atom or a methyl group; $R^4$ represents a hydrogen atom, a fluorine atom, or an alkyl group having 1 to 6 carbon atoms; and $R^5$ represents a hydrogen atom, or $R^5$ and $R^4$ taken together represent a cycloalkanediyl group having 3 to 8 carbon atoms together with the carbon atom to which $R^5$ and $R^4$ bond.

DESCRIPTION OF THE EMBODIMENTS

According to an embodiment of the invention which was made for solving the foregoing problems, a radiation-sensitive resin composition contains:

(A) a polymer including a structural unit (I) derived from a compound represented by the following formula (1), and a structural unit (II) derived from a compound represented by the following formula (2) (hereinafter, may be also referred to as "polymer (A)");

(B) an acid generating agent; and (C) an organic solvent.

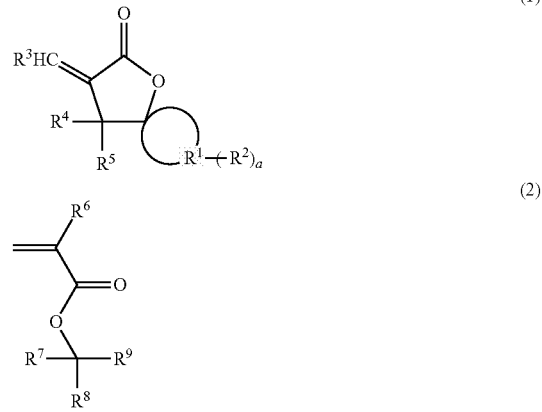

In the formula (1), $R^1$ represents an organic group having a valency of (a+2) that represents a ring structure having 3 to 8 carbon atoms taken together with a carbon atom constituting a lactone ring; $R^2$ represents a fluorine atom, a hydroxyl group or an organic group having 1 to 20 carbon atoms; a is an integer of 0 to 6, wherein in a case where a is 2 or greater, a plurality of $R^2$s are identical or different, or represent a ring structure taken together with each other, and wherein at least one group of $R^1$ and $R^2$ has a hetero atom or a halogen atom; $R^3$ represents a hydrogen atom or a methyl group; $R^4$ represents a hydrogen atom, a fluorine atom, or an alkyl group having 1 to 6 carbon atoms; and $R^5$ represents a hydrogen atom, or $R^5$ and $R^4$ taken together represent a cycloalkanediyl group having 3 to 8 carbon atoms together with the carbon atom to which $R^5$ and $R^4$ bond.

In the formula (2), $R^6$ represents a hydrogen atom or a methyl group; and $R^7$, $R^8$ and $R^9$ each independently represent an alkyl group having 1 to 6 carbon atoms, wherein hydrogen atoms of the alkyl group are not substituted or substituted, or $R^7$ and $R^8$ taken together represent a ring structure together with the carbon atom to which $R^7$ and $R^8$ bond.

According to the embodiment of the radiation-sensitive resin composition, the polymer (A) has superior resolving performances due to including the structural unit (I) derived from a compound having a spirolactone structure. Particularly, it is believed that the structural unit (I) has high polarity due to having in addition to an ester bond included in the spirolactone ring, a hetero atom or a halogen atom included in at least one group of $R^1$ and $R^2$ constituting the other ring structure, and consequently can efficiently improve resolving performances.

It is preferred that at least one group of $R^1$ and $R^2$ in the above formula (1) has an oxygen atom. Accordingly, polarity of the structural unit (I) is believed to be appropriately controlled, and consequently the resolving performances can be further improved.

$R^1$ in the above formula (1) preferably represents a chain hydrocarbon group having a valency of (a+2) that includes one or more of —CO—, —COO—, —OCO—, —O—, —NR—, —S—, —SO—, and —SO$_2$ (wherein, R represents a hydrogen atom or an organic group having 1 to 20 carbon atoms) in the skeleton chain. When the ring structure that includes $R^1$ has such a polar group, resolving ability can be further improved.

In the above formula (1), a is preferably 0 or 1. When a is 0 or 1, bulkiness of the ring structure that includes $R^1$ can be minimized, whereby the resolving performances can be further improved.

The compound represented by the above formula (2) is preferably represented by the following formula (2a) or formula (2b):

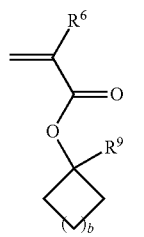

(2a)

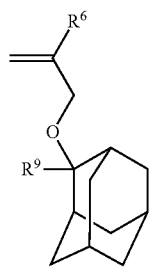

(2b)

in the formula (2a) and the formula (2b), $R^6$ and $R^9$ are as defined in the above formula (2), and b is an integer of 1 to 5.

According to the embodiment of the radiation-sensitive resin composition, the polymer (A) attains improved acid dissociability due to including a structural unit derived from a compound represented by the above formula (2a) or formula (2b) as the structural unit (II); therefore, the resolving performances such as the development contrast can be further improved.

According to another embodiment of the invention, a polymer includes a structural unit (I) derived from a compound represented by the following formula (1), and a structural unit (II) derived from a compound represented by the following formula (2):

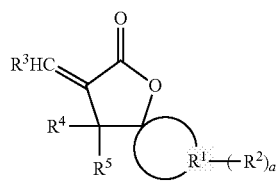

(1)

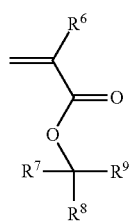

(2)

in the formula (1), $R^1$ represents an organic group having a valency of (a+2) that represents a ring structure having 3 to 8 carbon atoms taken together with a carbon atom constituting a lactone ring; $R^2$ represents a fluorine atom, a hydroxyl group or an organic group having 1 to 20 carbon atoms; a is an integer of 0 to 6, wherein in a case where a is 2 or greater, a plurality of $R^2$s are identical or different, or represent a ring structure taken together with each other, and wherein at least one group of $R^1$ and $R^2$ has a hetero atom or a halogen atom; $R^3$ represents a hydrogen atom or a methyl group; $R^4$ represents a hydrogen atom, a fluorine atom, or an alkyl group having 1 to 6 carbon atoms; and $R^5$ represents a hydrogen atom, or $R^5$ and $R^4$ taken together represent a cycloalkanediyl group having 3 to 8 carbon atoms together with the carbon atom to which $R^5$ and $R^4$ bond, and in the formula (2), $R^6$ represents a hydrogen atom or a methyl group; and $R^7$, $R^8$ and $R^9$ each independently represent an alkyl group having 1 to 6 carbon atoms, wherein hydrogen atoms of the alkyl group are not substituted or substituted, or $R^7$ and $R^8$ taken together represent a ring structure together with the carbon atom to which $R^7$ and $R^8$ bond.

The polymer can be used as a component of, for example, the radiation-sensitive resin composition as described above, and the composition can exhibit superior resolving performances.

$R^1$ in the above formula (1) preferably represents a chain hydrocarbon group having a valency of (a+2) that includes one or more of —CO—, —COO—, —OCO—, —O—, —NR—, —S—, —SO—, and —SO$_2$ (wherein, R represents a hydrogen atom or an organic group having 1 to 20 carbon atoms) in its skeleton chain. According to the polymer, the polarity provided at the ring structure moiety can be further responsible for improvement of resolving ability, and the like when used as a component of a radiation-sensitive resin composition.

According to yet another embodiment of the invention, a compound is represented by the following formula (1):

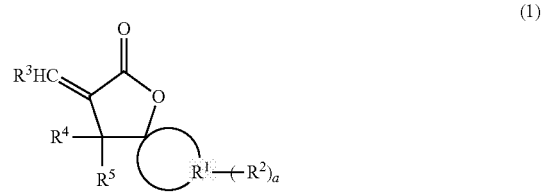

(1)

in the formula (1), $R^1$ represents an organic group having a valency of (a+2) that represents a ring structure having 3 to 8 carbon atoms taken together with a carbon atom constituting a lactone ring; $R^2$ represents a fluorine atom, a hydroxyl group or an organic group having 1 to 20 carbon atoms; a is an integer of 0 to 6, wherein in a case where a is 2 or greater, a plurality of $R^2$s are identical or different, or represent a ring structure taken together with each other, and wherein at least one group of $R^1$ and $R^2$ has a hetero atom or a halogen atom; $R^3$ represents a hydrogen atom or a methyl group; $R^4$ represents a hydrogen atom, a fluorine atom, or an alkyl group having 1 to 6 carbon atoms; and $R^5$ represents a hydrogen atom, or $R^5$ and $R^4$ taken together represent a cycloalkanediyl group having 3 to 8 carbon atoms together with the carbon atom to which $R^5$ and $R^4$ bond.

When the compound is used, due to having polarity at a specific ring structure moiety, the polymer (A) suitable as a component of a radiation-sensitive resin composition can be readily produced.

$R^1$ in the above formula (1) preferably represents one or more of —CO—, —COO—, —OCO—, —O—, —NR—, —S—, —SO—, and —SO$_2$ (wherein, R represents a hydrogen atom or an organic group having 1 to 20 carbon atoms) in its skeleton chain. By using the compound, the polymer (A) having polarity at a specific ring structure moiety can be more readily produced.

As described in the foregoing, the radiation-sensitive resin composition according to the embodiment of the present invention enables resolving performances (for example, high sensitivity, and achievability of favorable pattern configuration) to be improved due to having appropriate polarity at a specific moiety. Therefore, the radiation-sensitive resin composition enables further miniaturization of resist patterns. In addition, the polymer according to the embodiment of the present invention can be suitably used for the radiation-sensitive resin composition, and the compound according to the embodiment of the present invention enables the polymer to be readily produced.

Hereinafter, embodiments of the radiation-sensitive resin composition according to the embodiment of the present invention, polymer and compound will be described in detail.

Radiation-Sensitive Resin Composition

The radiation-sensitive resin composition contains (A) a polymer, (B) an acid generator and (C) an organic solvent, and may further contain the other optional component. Each of the components will be sequentially explained below.

Polymer (A)

The polymer (A) includes a structural unit (I) derived from a compound represented by the above formula (1), and a structural unit (II) derived from a compound represented by the above formula (2).

Structural Unit (I)

Since the polymer (A) includes the structural unit (I) derived from a compound having a spirolactone structure, the resultant resist coating film is superior in adhesiveness and development contrast. Particularly, the structural unit (I) has high polarity due to having in addition to an ester bond included in the spirolactone ring, a hetero atom or a halogen atom included in at least one group of $R^1$ and $R^2$ constituting the other ring structure, and consequently can efficiently improve solubility and resolving performances. In addition, due to the polymer (A) including the structural unit (I) derived from a compound having a spirolactone structure, the resultant resist coating film has increased rigidity, and superior etching resistance is attained since $R^1$ is less likely to be removed.

Examples of the hetero atom include an oxygen atom, a nitrogen atom, a sulfur atom, a silicon atom, and a phosphorus atom.

Examples of the halogen atom include a chlorine atom, a fluorine atom, and the like.

$R^1$ represents a monocyclic ring structure having 3 to 8 carbon atoms taken together with a carbon atom constituting a lactone ring. The ring structure is exemplified by a monocyclic alicyclic structure, a heterocyclic structure, an aromatic ring structure, etc., each having 3 to 8 carbon atoms. Of these ring structures, $R^1$ preferably represents a heterocyclic structure which is a chain hydrocarbon group having a valency of (a+2) that includes one or more of —CO—, —COO—, —OCO—, —O—, —NR—, —S—, —SO—, and —SO$_2$ (wherein, R represents a hydrogen atom or an organic group having 1 to 20 carbon atoms) in the skeleton chain. When the ring structure that includes $R^1$ has such a polar group, the resolving ability can be further improved. In addition, it is also preferred that the ring structure that includes $R^1$ be a monocyclic alicyclic structure, depending on $R^2$ selected.

The ring structure in which $R^1$ represents a chain hydrocarbon group having —CO— in the skeleton chain is exemplified by a cyclic ketone structure having 3 to 8 carbon atoms, and the like.

The ring structure in which $R^1$ represents a chain hydrocarbon group having —COO— in the skeleton chain is exemplified by a lactone structure having 3 to 8 carbon atoms, and the like.

The ring structure in which $R^1$ represents a chain hydrocarbon group having —O— in the skeleton chain is exemplified by a cyclic ether structure having 3 to 8 carbon atoms, and the like.

The ring structure in which $R^1$ represents a chain hydrocarbon group having —NR— in the skeleton chain is exemplified by a cyclic amine structure having 3 to 8 carbon atoms, and the like. The organic group having 1 to 20 carbon atoms represented by R is exemplified by a chain hydrocarbon group, an aliphatic cyclic hydrocarbon group, an aromatic hydrocarbon group each having 1 to 20 carbon atoms, an epoxy group, a cyano group, a carboxyl group, and the like.

The ring structure in which $R^1$ represents a chain hydrocarbon group having —S— in the skeleton chain is exemplified by a cyclic thio ether structure having 3 to 8 carbon atoms, and the like.

The ring structure in which $R^1$ represents a chain hydrocarbon group having —SO— in the skeleton chain is exemplified by a cyclic sulfoxide structure having 3 to 8 carbon atoms, and the like.

The ring structure in which $R^1$ represents a chain hydrocarbon group having —SO$_2$— in the skeleton chain is exemplified by a cyclic sulfone structure having 3 to 8 carbon atoms, and the like.

Also, the ring structure represented by $R^1$ taken together with the carbon atom constituting the lactone ring preferably has a five-membered or six-membered ring structure, in light of ease in synthesis.

$R^2$ represents a fluorine atom, a hydroxyl group or an organic group having 1 to 20 carbon atoms.

The organic group having 1 to 20 carbon atoms represented by $R^2$ is each exemplified by a chain hydrocarbon group having 1 to 20 carbon atoms, an aliphatic cyclic hydrocarbon group having 3 to 20 carbon atoms, an aromatic hydrocarbon group having 6 to 20 carbon atoms, an epoxy group, a cyano group, a carboxyl group, or a group represented by —R'—X—R" (wherein, R' represents a single bond or a hydrocarbon group having 1 to 10 carbon atoms; R" represents an unsubstituted or substituted hydrocarbon group having 1 to 20 carbon atoms, an alkylsilyl group having 1 to 20 carbon atoms or a monovalent group having a heterocyclic structure; and X is one or more of —O—, —CO— and NH—), and the like. A part or all of hydrogen atoms included in the chain hydrocarbon group, aliphatic cyclic hydrocarbon group and aromatic hydrocarbon group are not substituted or substituted by a halogen atom such as a fluorine atom, a cyano group, a carboxyl group, a hydroxyl group, a thiol group or the like. Also, the alkylsilyl group represented by R" is exemplified by a trimethylsilyl group, a tert-butyldimethylsilyl group, and the like. The monovalent group having a heterocyclic structure represented by R" is preferably a lactone structure and a cyclic ether structure.

Among the organic groups having 1 to 20 carbon atoms represented by $R^2$, a chain hydrocarbon having 1 to 5 carbon atoms such as a methyl group, an ethyl group or a propyl group, an alkoxy group having 1 to 5 carbon atoms such as a methoxy group or an ethoxy group, an alkoxycarbonyl group having 1 to 5 carbon atoms such as a methoxycarbonyl group or an ethoxycarbonyl group, an oxacycloalkyloxy group having 2 to 10 carbon atoms such as an oxacyclohexyloxy group are preferred, and a methyl group, a methoxy group, an ethoxycarbonyl group and an oxacycloalkyloxy group are particularly preferred.

In addition, when a is no less than 2, a plurality of $R^2$s may represent a ring structure taken together with each other, and in this instance, $R^2$ represents a spiro ring or a polycyclic structure such as a norbornane structure or an adamantane structure together with $R^1$ and a carbon atom forming the lactone ring.

It is to be noted that a in the above formula (1) is preferably 0 or 1. When a is 0 or 1, bulkiness of the ring structure that includes $R^1$ can be minimized, whereby the resolving performances can be further improved.

$R^3$ represents a hydrogen atom or a methyl group. It is to be noted that when $R^3$ represents a methyl group, $R^3$ may be bonded at either cis-position or trans-position.

$R^4$ represents a hydrogen atom, a fluorine atom, or an alkyl group having 1 to 6 carbon atoms. Examples of the alkyl group having 1 to 6 carbon atoms include a methyl group, an ethyl group, a n-propyl group, and the like. $R^5$ represents a hydrogen atom, or $R^5$ and $R^4$ taken together represent a cycloalkanediyl group having 3 to 8 carbon atoms together with the carbon atom to which $R^5$ and $R^4$ bond. Examples of the cycloalkanediyl group include a cyclopentanediyl group, a cyclohexanediyl group, and the like.

Specific examples of the compound represented by the above formula (1) that gives the structural unit (I) include compounds represented by the following formulae (1-1) to (1-73).

(1-1)

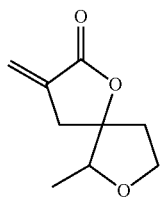

(1-2)

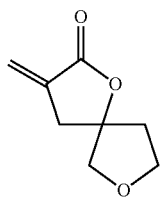

(1-3)

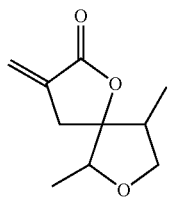

(1-4)

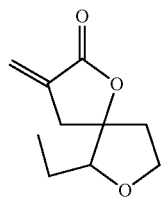

(1-5)

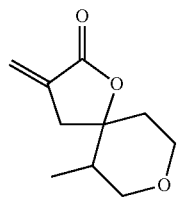

(1-6)

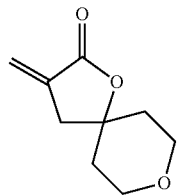

(1-7)

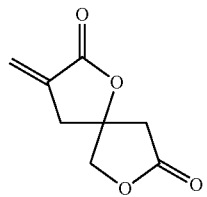

(1-8)

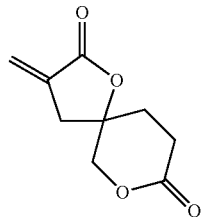

(1-9)

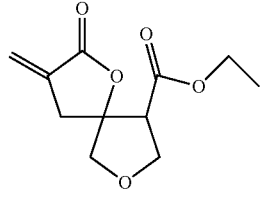

(1-10)

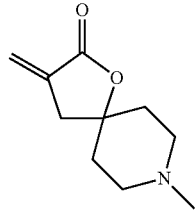

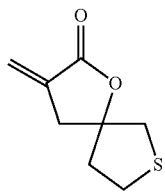 (1-11)
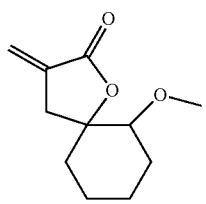 (1-12)
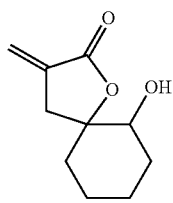 (1-13)
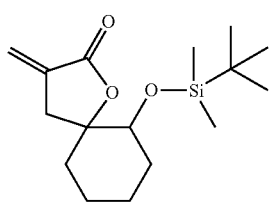 (1-14)
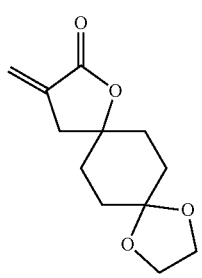 (1-15)
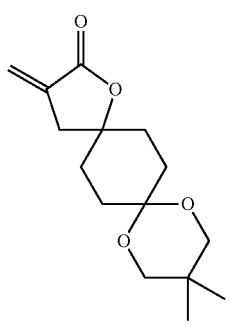 (1-16)
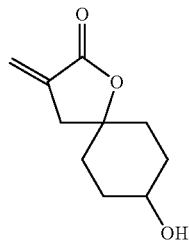 (1-17)
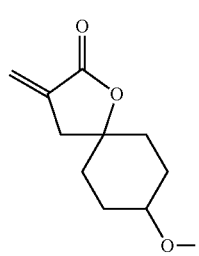 (1-18)
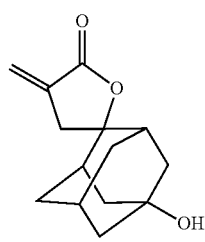 (1-19)
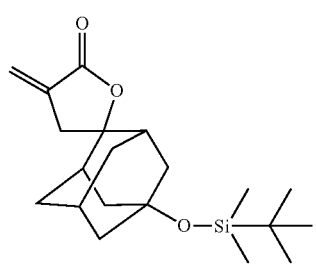 (1-20)
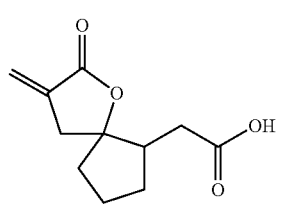 (1-21)
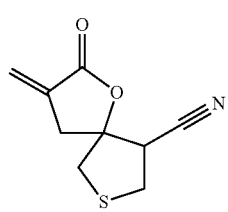 (1-22)

(1-23) 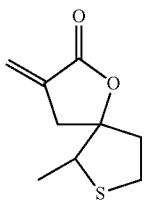
(1-24) 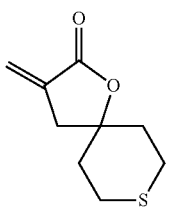
(1-25) 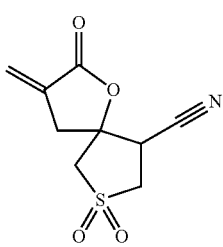
(1-26) 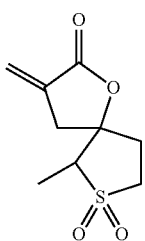
(1-27) 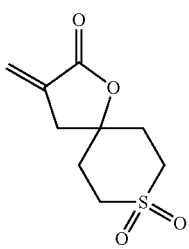
(1-28) 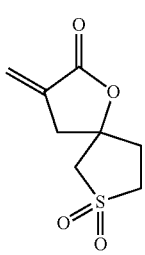
(1-29) 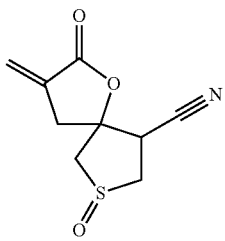
(1-30) 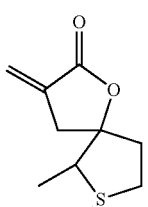
(1-31) 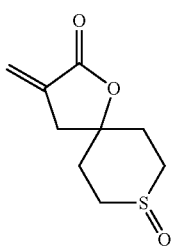
(1-32) 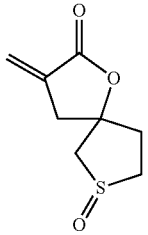
(1-33) 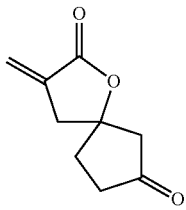
(1-34) 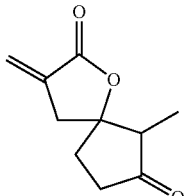
(1-35) 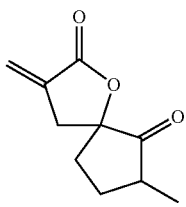

(1-36) 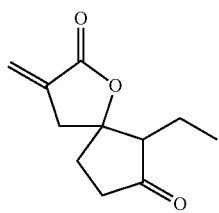
(1-37) 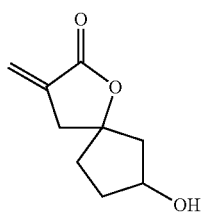
(1-38) 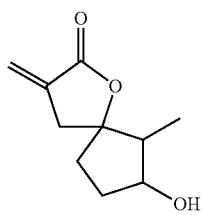
(1-39) 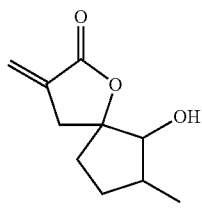
(1-40) 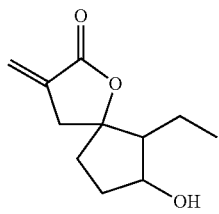
(1-41) 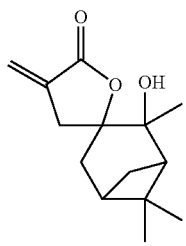
(1-42) 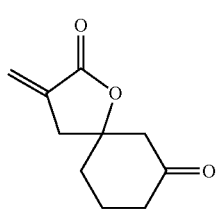
(1-43) 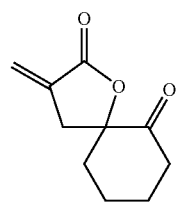
(1-44) 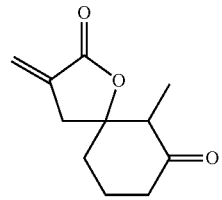
(1-45) 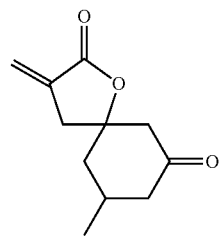
(1-46) 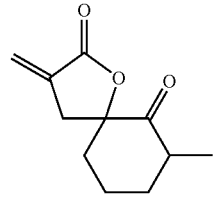
(1-47) 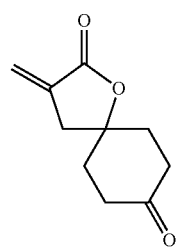
(1-48) 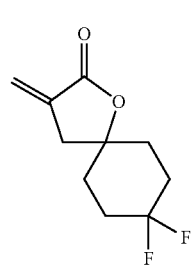
(1-49) 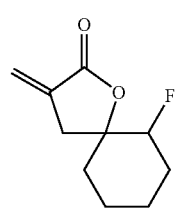

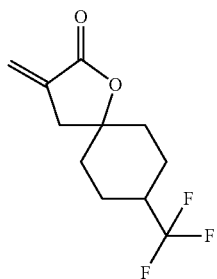
(1-50)
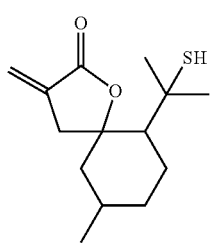
(1-51)
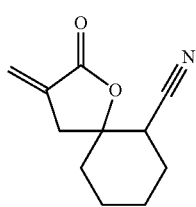
(1-52)
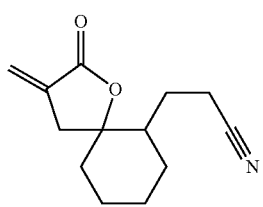
(1-53)
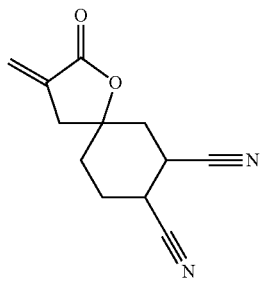
(1-54)
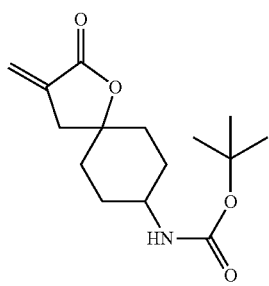
(1-55)
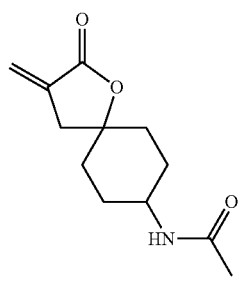
(1-56)
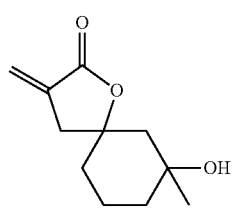
(1-57)
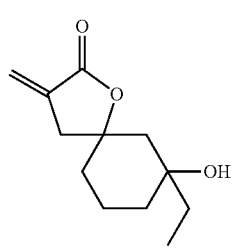
(1-58)
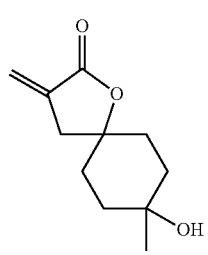
(1-59)
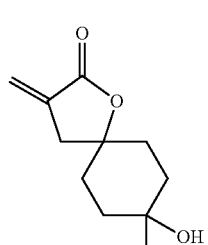
(1-60)
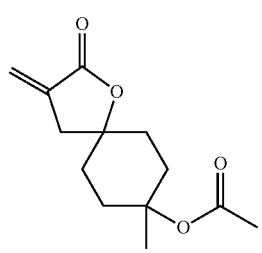
(1-61)

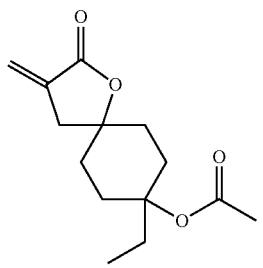
(1-62)
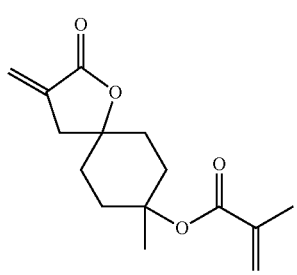
(1-63)
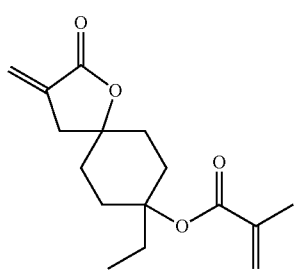
(1-64)
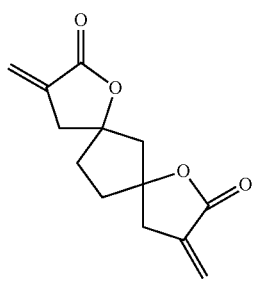
(1-65)
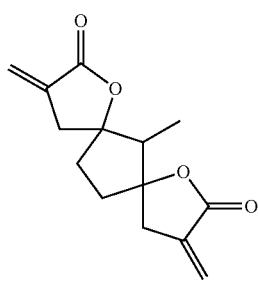
(1-66)
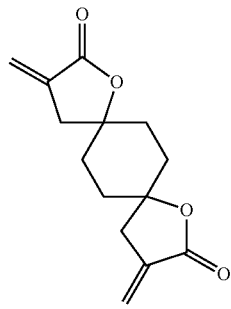
(1-67)
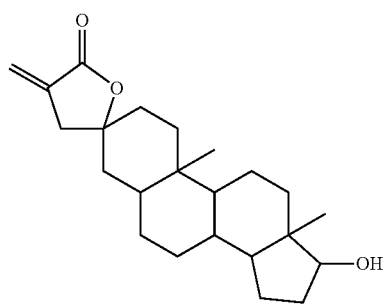
(1-68)
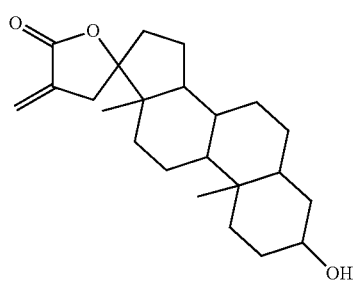
(1-69)
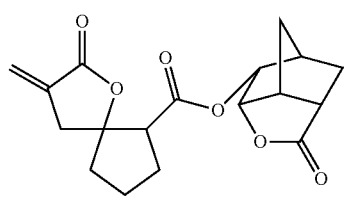
(1-70)
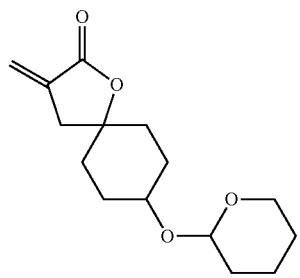
(1-71)

-continued (1-72)

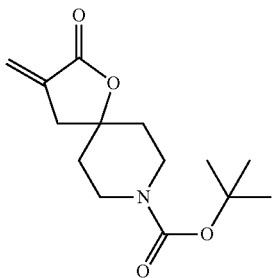

(1-73)

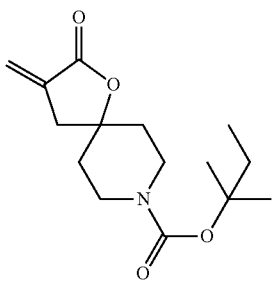

Among these, compounds represented by formulae (1-1) to (1-9), (1-12) to (1-22) and the like having an oxygen atom as the hetero atom or the halogen atom included in at least one group of $R^1$ and $R^2$ are preferred. It is more preferred that the oxygen atom be included as an ether structure or a hydroxyl group. In particular, the hetero atom or the halogen atom included in $R^1$ and $R^2$ is more preferably an oxygen atom alone, and still more preferably 1 or 2 oxygen atom(s) alone. Furthermore, $R^1$ and $R^2$ preferably has a structure in which atoms are linked by a single bond alone. When $R^1$ and $R^2$ have such a structure, polarity of the structural unit (I) is believed to be appropriately controlled, and consequently the resolving performances can be further improved. In addition, compounds represented by formulae (1-1) to (1-6) and (1-15), and the like having a cyclic ether structure are more preferred, and a compound represented by formula (1-1) is particularly preferred.

In the polymer (A), the content of the structural unit (I) in terms of the total amount of the structural unit (I) with respect to the entire structural units constituting the polymer (A) is preferably no less than 5 mol % and no greater than 70 mol %, and still more preferably no less than 5 mol % can no greater than 50 mol %. When the content of the structural unit (I) falls within the above range, it is possible to exhibit superior resolving ability while maintaining other performances.

Production Method of the Compound Represented by the Above Formula (1)

A production method of the compound represented by the above formula (1) may include a synthesis scheme represented by the following formula.

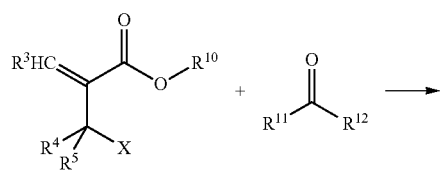

-continued

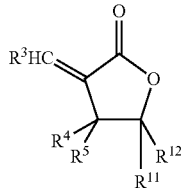

In the above scheme, $R^3$, $R^4$ and $R^5$ are as defined in the above formula (1); $R^{10}$ represents an organic group having 1 to 20 carbon atoms; and $R^{11}$ and $R^{12}$ each independently represent an organic group having 1 to 20 carbon atoms, wherein at least either one of $R^{11}$ or $R^{12}$ has a hetero atom or a halogen atom. Alternatively, $R^{11}$ and $R^{12}$ may represent a ring taken together with each other.

$R^{10}$ in the above scheme preferably represents an alkyl group, and more preferably an alkyl group having 1 to 6 carbon atoms. Specific examples of $R^{10}$ include a methyl group, an ethyl group, a n-propyl group, an isopropyl group, a n-butyl group, a 1-methylpropyl group, a 2-methylpropyl group, a 1,1-dimethylethyl group, a n-pentyl group, a 1-methylbutyl group, a 1-ethylpropyl group, a 1,1-dimethylpropyl group, a 2,2-dimethylpropyl group, a n-hexyl group, and the like. Of these, in light of ease of handling and availability, a methyl group, an ethyl group, a n-propyl group, an isopropyl group, a n-butyl group, and a 1,1-dimethylethyl group are preferred.

$R^{11}$ and $R^{12}$ in the above scheme preferably represent an organic group having 1 to 20 carbon atoms. More preferably, $R^{11}$ and $R^{12}$ preferably represent a ring taken together with adjacent carbon atoms.

Specifically, a production method of the compound represented by the above formula (1-1) may involve the followings.

Into a tetrahydrofuran (THF) solvent containing a zinc powder added as a catalyst, 2-methyltetrahydrofuran-3-one (compound a) and ethyl 2-(bromomethyl)acrylate (compound b) each dissolved in THF are added dropwise, and the mixture is stirred at room temperature to allow the compound a and the compound b to be reacted, whereby 6-methyl-3-methylene-1,7-dioxaspiro[4,4]nonan-2-one (compound represented by the above formula (1-1)) is synthesized. It is preferred to add an activator such as chlorotrimethylsilane into the THF solvent containing a zinc powder, prior to adding the compounds a and b. Also, compounds other than the compound represented by the formula (1-1) can be synthesized in a similar manner with the compound a appropriately changed, or the like.

Structural Unit (II)

Since the polymer (A) includes the structural unit (II) having an acid-dissociable group, resolving performances as a resist of the radiation-sensitive resin composition can be suitably exhibited.

Examples of the alkyl group having 1 to 6 carbon atoms represented by $R^7$, $R^8$ and $R^9$ in the formula (2) representing a compound that gives the structural unit (II) include a methyl group, an ethyl group, a n-propyl group, and the like. Examples of the group that substitute for hydrogen atom of these alkyl groups include a hydroxyl group, a cyano group, a carboxyl group, a halogen atom, and the like.

Examples of the ring structure taken together represented by $R^7$ and $R^8$ together with the carbon atom to which $R^7$ and $R^8$ bond include a cycloalkanediyl group having 3 to 10 carbon atoms, a norbornanediyl group, an adamantanediyl group, and the like.

Specific examples of the compound represented by the formula (2) include compounds represented by the following formulae (2-1) to (2-11).

(2-1)
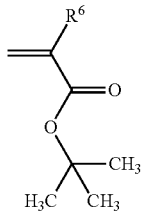

(2-2)
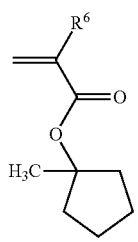

(2-3)
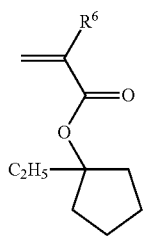

(2-4)
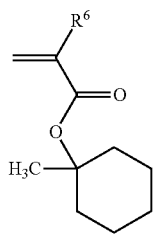

(2-5)
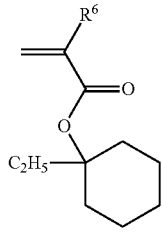

(2-6)
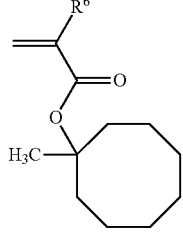

(2-7)
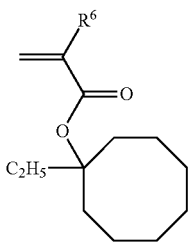

(2-8)
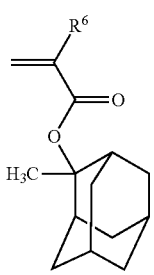

(2-9)
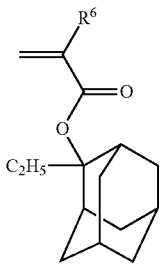

(2-10)
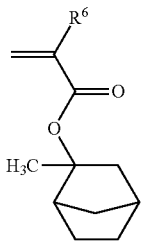

(2-11)
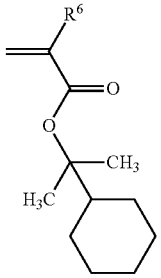

In the above formula, $R^6$ is as defined in the formula (2).

Among these, compounds represented by the above formula (2a) such as formulae (2-2) to (2-7), compounds represented by the above formula (2b) such as formulae (2-8) and (2-9) are preferred since the development contrast can be further improved due to increased solubility in a developer solution by an acid.

In the polymer (A), the content of the structural unit (II) in terms of the total amount of the structural unit (II) with respect to the entire structural units constituting the polymer (A) is preferably no less than 20 mol % and no greater than 80 mol %, and more preferably no less than 25 mol % and no greater than 60 mol %. When the content of the structural unit (II) falls within the above range, the development contrast can be further improved.

Other Structural Unit

Also, the polymer may have a structural unit other than the structural unit (I) and the structural unit (II). Such a structural unit is exemplified by a structural unit having a lactone structure or a cyclic carbonate structure (hereinafter, may be also referred to as "structural unit (III)). In this regard, the structural unit (III) does not include the structural unit (I). When the polymer (A) includes the structural unit (III), adhesiveness and the like of the resist coating film can be further improved.

A compound that can give the structural unit (III) is exemplified by compounds represented by the following formulae.

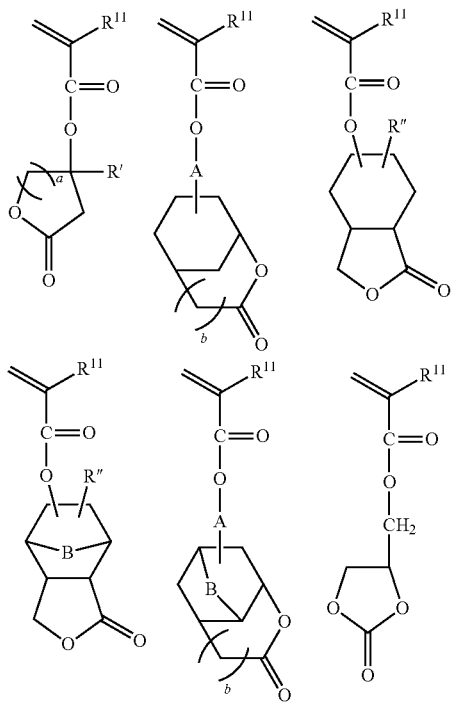

In the above formulae, $R^{11}$ and R' each independently represent a hydrogen atom or a methyl group; R" each independently represents a hydrogen atom or methoxy; A each independently represents a single bond, a methylene group, *—$CH_2COO$—, and *—$CH_2CH_2O$—, wherein * denotes a binding site with an oxygen atom; B each independently represents a methylene group or an oxygen atom; and a and b are each independently an integer of 0 to 2.

In the polymer (A), the content of the structural unit (III) in terms of the total amount of the structural unit (III) with respect to the entire structural units constituting the polymer (A) is preferably no less than 10 mol % and no greater than 60 mol %, and still more preferably no less than 15 mol % and no greater than 50 mol %. When the content of the structural unit (III) falls within the above range, the development contrast can be further improved, and the adhesiveness of resist coating film can be further improved. It is to be noted that in the polymer (A), the total content of the structural unit (I) and the structural unit (III) with respect to the entire structural units constituting the polymer (A) is preferably no less than 30 mol % and no greater than 70 mol %, since lithography performances as a resist can be further improved.

Production Method of Polymer (A)

The polymer (A) may be synthesized according to routine methods such as radical polymerization. For example, it is preferred to synthesize the polymer (A) by:

a method in which a solution containing a monomer and a radical initiator is added dropwise to another solution containing a reaction solvent or the monomer, and the mixture is polymerized;

a method in which a solution containing a monomer and a solution containing a radical initiator are each separately added dropwise to another solution containing a reaction solvent or the monomer, and the mixture is polymerized;

a method in which a plurality of solutions each containing a single monomer and a solution containing a radical initiator are each separately added dropwise to another solution containing a reaction solvent or the monomer, and the mixture is polymerized; and the like.

It is to be noted that when the reaction is permitted by adding a monomer solution dropwise to a monomer solution, the amount of the monomer in the monomer solution added dropwise is preferably no less than 30 mol %, more preferably no less than 50 mol %, and still more preferably no less than 70 mol % with respect to the total amount of the monomer used in the polymerization.

The reaction temperature in the method described above may be appropriately determined in accordance of the type of the initiator. The reaction temperature is typically 30° C. to 180° C., preferably 40° C. to 160° C., and still more preferably 50° C. to 140° C. The time period of the dropwise addition may vary depending on conditions such as reaction temperature, initiator type, the monomer to be reacted and the like, and is typically, 30 min to 8 hrs, preferably 45 min to 6 hrs, and more preferably 1 hr to 5 hrs. In addition, the total reaction time including the dropwise addition may also vary similarly to the time period of the dropwise addition, and is typically 30 min to 8 hrs, preferably 45 min to 7 hrs, and more preferably 1 hr to 6 hrs.

The radical initiator for use in the polymerization is exemplified by azobisisobutyronitrile (AIBN), 2,2'-azobis(4-methoxy-2,4-dimethylvaleronitrile), 2,2'-azobis(2-cyclopropylpropionitrile), 2,2'-azobis(2,4-dimethylvaleronitrile), and the like. These initiators may be used either alone or as a mixture of two or more thereof.

A solvent for polymerization is not limited as long as the solvent is other than those that inhibit polymerization (nitrobenzene having a polymerization inhibitory effect, mercapto compounds having a chain transfer effect, etc.), and is capable of dissolving the monomer. Examples of the solvent for polymerization include alcohol solvents, ketone solvents, amide solvents, ester lactone solvents, nitrile solvents and mixed solvents thereof, and the like. These solvents may be used either alone or in combination of two or more types thereof.

The resin obtained by the polymerization reaction may be recovered preferably by a reprecipitation technique. More specifically, after the polymerization reaction is completed, the polymerization mixture is charged into a solvent for reprecipitation, whereby a target resin is recovered in a powdery form. As the reprecipitation solvent, an alcohol, an alkane or the like may be used either alone or as a mixture of two or more thereof. Alternatively to the reprecipitation technique, liquid separating operation, column operation, ultrafiltration operation or the like may be employed to recover the resin through eliminating low molecular components such as monomers and oligomers.

The Mw of the polymer (A) as determined by a GPC method is preferably 1,000 to 100,000, more preferably 2,000 to 50,000, and particularly preferably 3,000 to 20,000. When the Mw of the polymer (A) falls within the above range, sufficient solubility in a resist solvent for use as a resist is attained, and more favorable resistance to dry-etching and adhesiveness can be provided.

A ratio (Mw/Mn) of the Mw to Mn of the polymer (A) is typically 1 to 3, and preferably 1 to 2.

Acid Generating Agent (B)

The acid generating agent (B) generates an acid upon exposure, and the acid allows an acid-dissociable group present in the polymer (A) to be dissociated and to generate an acid. As a result, the acid-dissociable group in the polymer (A) is dissociated, leading to a change in the solubility, thereby enabling a resist pattern to be formed by development.

Examples of the acid generating agent (B) include onium salt compounds, sulfonimide compounds, halogen-containing compounds, diazoketone compounds, and the like. Among these acid generating agents (B), onium salt compounds are preferred.

Examples of the onium salt compound include sulfonium salts (including tetrahydrothiophenium salts), iodonium salts, phosphonium salts, diazonium salts, pyridinium salts, and the like. The acid generating agent (B) according to the embodiment of the present invention preferably contains a compound represented by the following formula (B-1).

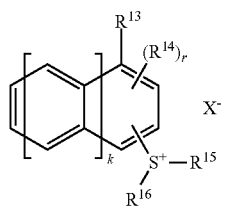
(B-1)

In the above formula (B-1), $R^{13}$ represents a hydrogen atom, a fluorine atom, a hydroxyl group, an alkyl group having 1 to 10 carbon atoms, an alkoxyl group having 1 to 10 carbon atoms, or an alkoxycarbonyl group having 2 to 11 carbon atoms; $R^{14}$ represents an alkyl group having 1 to 10 carbon atoms, an alkoxyl group having 1 to 10 carbon atoms, or an alkanesulfonyl group having 1 to 10 carbon atoms; and $R^{15}$ and $R^{16}$ each independently represent an aromatic hydrocarbon group or an alkyl group having 1 to 10 carbon atoms which may be substituted, wherein $R^{15}$ and $R^{16}$ may taken together represent a divalent group having 2 to 10 carbon atoms by binding to each other. "k" is an integer of 0 to 2; r is an integer of 0 to 10; and $X^-$ is an anion represented by the following formulae (b-1) to (b-3).

$$R^{17}-X-C_xY_{2x}SO_3^-: \quad (b\text{-}1)$$

In the above formula (b-1), $R^{17}$ represents a hydrogen atom, a fluorine atom, or a hydrocarbon group having 1 to 20 carbon atoms; X is a single bond, an ether bond, an ester bond or an amide bond; Y is a hydrogen atom or a fluorine atom, wherein Ys present in a plurality of number are identical or different; and x is an integer of 1 to 10.

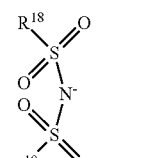
(b-2)

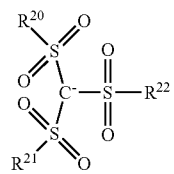
(b-3)

In the above formulae (b-2) and (b-3), $R^{18}$ to $R^{22}$ each independently represent a fluorine-substituted alkyl group having 1 to 10 carbon atoms, wherein $R^{18}$ and $R^{19}$, or two among $R^{20}$ to $R^{22}$ may taken together represent a divalent fluorine-substituted alkylene group having 2 to 10 carbon atoms.

In the above formula (B-1), the alkyl group having 1 to 10 carbon atoms represented by $R^{13}$ to $R^{16}$ is preferably a methyl group, an ethyl group, a n-propyl group, an i-propyl group, a t-butyl group, a n-pentyl group, a n-hexyl group, a n-heptyl group, a n-octyl group, a n-nonyl group, a n-decyl group, a neopentyl group, a 2-ethylhexyl group, or the like. Of these, a methyl group, an ethyl group, a n-butyl group and a t-butyl group are preferred.

Furthermore, the alkoxyl group having 1 to 10 carbon atoms represented by $R^{13}$ and $R^{14}$ is preferably a methoxy group, an ethoxy group, a n-propoxy group, or a n-butoxy group.

Moreover, the alkoxycarbonyl group having 2 to 11 carbon atoms represented by $R^{13}$ is preferably a methoxycarbonyl group, an ethoxycarbonyl group, or a n-butoxycarbonyl group.

In addition, the alkanesulfonyl group having 1 to 10 carbon atoms represented by $R^{14}$ is preferably a methanesulfonyl group, an ethanesulfonyl group, a n-propanesulfonyl group, a n-butanesulfonyl group, a cyclopentanesulfonyl group, or a cyclohexanesulfonyl group.

Additionally, in the above formula (B-1), r is preferably an integer of 0 to 2.

In the above formula (B-1), examples of the aromatic hydrocarbon group represented by $R^{15}$ and $R^{16}$ include a phenyl group, an o-tolyl group, a m-tolyl group, a p-tolyl group, a 2,3-dimethyl phenyl group, and the like. The aromatic hydrocarbon group represented by $R^{15}$ and $R^{16}$ may be derived from these groups by substituting hydrogen atom(s) by at least one group selected from the set of a hydroxyl group, a carboxyl group, a cyano group, a nitro group, an alkoxyl group, an alkoxyalkyl group, an alkoxycarbonyl group and an alkoxycarbonyloxy group.

Examples of the alkoxyalkyl group include a methoxymethyl group, an ethoxymethyl group, a 2-methoxyethyl group, a 2-ethoxyethyl group, a 1-methoxyethyl group, a 1-ethoxyethyl group, an alkoxyalkyl group having a cycloalkane structure, and the like. These groups preferably have 1 to 20 carbon atoms.

Examples of the alkoxycarbonyl group include a methoxycarbonyl group, an ethoxycarbonyl group, a n-propoxycarbonyl group, a n-butoxycarbonyl group, an i-propoxycarbonyl group, a 2-methylpropoxy carbonyl group, a 1-methylpropoxycarbonyl group, a t-butoxycarbonyl group, a cyclopentyloxycarbonyl group, a cyclohexyloxycarbonyl group, and the like. These groups preferably have 2 to 21 carbon atoms.

Examples of the alkoxycarbonyloxy group include linear alkoxycarbonyloxy groups such as a methoxycarbonyloxy group, an ethoxycarbonyloxy group, a n-propoxy carbonyloxy group and a n-butoxycarbonyloxy group; branched alkoxycarbonyloxy groups such as an i-propoxy carbonyloxy group and a t-butoxycarbonyloxy group; cycloalkyloxycarbonyl groups such as a cyclopentyloxycarbonyl group and a cyclohexyloxycarbonyl; and the like. These groups preferably have 2 to 21 carbon atoms.

In addition, the "divalent group having 2 to 10 carbon atoms" taken together represented by $R^{15}$ and $R^{16}$ by binding to each other preferably has a structure in which $R^{15}$ and $R^{16}$ bind with each other to form a five-membered or six-membered ring together with a sulfur atom in the above formula (B-1); in particular, a structure in which $R^{15}$ and $R^{16}$ bind with each other to form a five-membered ring (tetrahydrothiophene ring) is preferred.

The cation in the above formula (B-1) is preferably a triphenylsulfonium cation, a tri-1-naphthylsulfonium cation, a tri-tert-butylphenylsulfonium cation, a 4-fluorophenyl-diphenylsulfonium cation, a di-4-fluorophenyl-phenylsulfonium cation, a tri-4-fluorophenylsulfonium cation, a 4-cyclohexyl phenyl-diphenylsulfonium cation, a 4-methanesulfonyl phenyl-diphenylsulfonium cation, a 4-cyclohexanesulfonyl-diphenylsulfonium cation, a 1-naphthyldimethylsulfonium cation, a 1-naphthyldiethylsulfonium cation, a 1-(4-hydroxynaphthyl)dimethylsulfonium cation, a 1-(4-methylnaphthyl)dimethylsulfonium cation, a 1-(4-methylnaphthyl)diethylsulfonium cation, a 1-(4-cyano naphthyl)dimethylsulfonium cation, a 1-(4-cyano naphthyl)diethylsulfonium cation, a 1-(3,5-dimethyl-4-hydroxyphenyl)tetrahydrothiophenium cation, a 1-(4-methoxynaphthyl) tetrahydrothiophenium cation, a 1-(4-ethoxynaphthyl) tetrahydrothiophenium cation, a 1-(4-n-propoxy naphthyl) tetrahydrothiophenium cation, a 1-(4-n-butoxynaphthyl) tetrahydrothiophenium cation, a 2-(7-methoxynaphthyl) tetrahydrothiophenium cation, a 2-(7-ethoxynaphthyl) tetrahydrothiophenium cation, a 2-(7-n-propoxy naphthyl) tetrahydrothiophenium cation, a 2-(7-n-butoxynaphthyl) tetrahydrothiophenium cation, or the like.

In the above formula (b-1), the hydrocarbon group having 1 to 12 carbon atoms represented by $R^{17}$ is preferably an alkyl group having 1 to 12 carbon atoms, a cycloalkyl group, a bridged alicyclic hydrocarbon group such as an adamantyl group is preferred, and an adamantyl group is preferred among these.

In the above formulae (b-2) and (b-3), the fluorine-substituted alkyl group having 1 to 10 carbon atoms represented by $R^{18}$ to $R^{22}$ is exemplified by a trifluoromethyl group, a pentafluoroethyl group, a heptafluoropropyl group, a nonafluorobutyl group, a dodecafluoropentyl group, a perfluorooctyl group, and the like.

The divalent fluorine-substituted alkylene group having 2 to 10 carbon atoms taken together represented by $R^{18}$ and $R^{19}$, or two of $R^{20}$ to $R^{22}$ by binding to each other is exemplified by a tetrafluoroethylene group, a hexafluoropropylene group, an octafluorobutylene group, a decafluoropentylene group, an undecafluorohexylene group, or the like.

An anion moiety in the above formula (B-1) is preferably a trifluoromethanesulfonate anion, a perfluoro-n-butanesulfonate anion, a perfluoro-n-octanesulfonate anion, a 2-(bicyclo[2.2.1]hepta-2-yl)-1,1,2,2-tetrafluoroethanesulfonate anion, a 2-(bicyclo[2.2.1]hepta-2-yl)-1,1-difluoroethanesulfonate anion, a 1-adamantylsulfonate anion, as well as an anion represented by the following formulae (b-3a) to (b-3 g).

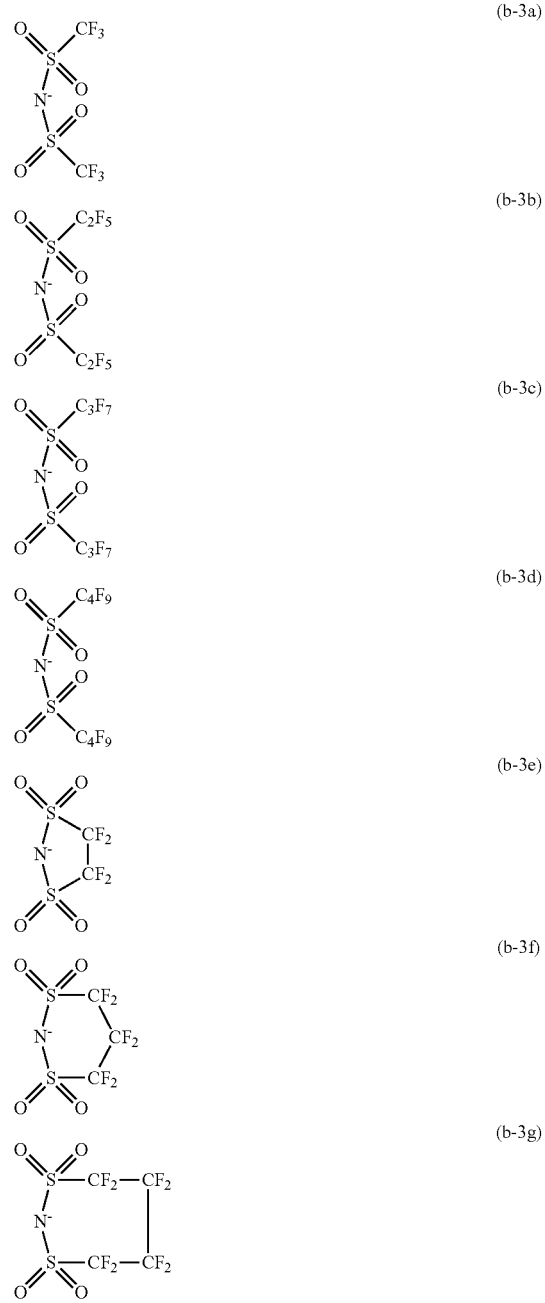

These acid generating agents may be used either alone of one type, or as a mixture of two or more thereof.

The content of the acid generating agent (B) in the radiation-sensitive resin composition according to the embodiment of the present invention is, in light of securement of sensitivity and developability as a resist, typically 0.1 to 30 parts by mass, and preferably 0.5 to 20 parts by mass with respect to 100 parts by mass of the polymer (A). When the content is less than 0.1 parts by mass, the sensitivity and developability tend to be deceased. On the other hand, when the content is greater than 30 parts by mass, radiation transmittance is decreased, and a rectangular resist pattern tends to be less likely to be obtained.

Organic Solvent (C)

The organic solvent (C) is not particularly limited as long as it is a solvent capable of dissolving at least the polymer (A), the acid generating agent (B) and other optional component(s) added if desired. As the organic solvent (C), an alcohol solvent, an ether solvent, a ketone organic solvent, an amide solvent, an ester organic solvent, a hydrocarbon solvent or the like may be used.

Examples of the alcohol solvent include:

monohydric alcohol solvents such as methanol, ethanol, n-propanol, i-propanol, n-butanol, i-butanol, sec-butanol, tert-butanol, n-pentanol, i-pentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol and diacetone alcohol;

polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol and tripropylene glycol;

partially etherified polyhydric alcohol solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether; and the like.

Examples of the ether solvent include diethyl ether, dipropyl ether, dibutyl ether, diphenyl ether, and the like.

Examples of the ketone solvent include ketone solvents such as acetone, methyl ethyl ketone, methyl n-propyl ketone, methyl n-butyl ketone, diethyl ketone, methyl isobutyl ketone, methyl n-pentyl ketone, ethyl-n-butyl ketone, methyl n-hexyl ketone, di-isobutyl ketone, trimethylnonanone, cyclopentanone, cyclohexanone, cycloheptanone, cyclooctanone, methylcyclohexanone, 2,4-pentanedione, acetonylacetone, and acetophenone.

Examples of the amide solvent include N,N'-dimethylimidazolidinone, N-methylformamide, N,N-dimethylformamide, N,N-diethylformamide, acetamide, N-methylacetamide, N,N-dimethylacetamide, N-methylpropionamide, N-methylpyrrolidone, and the like.

Examples of the ester solvent include diethyl carbonate, propylene carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like.

Examples of the hydrocarbon solvent include:

aliphatic hydrocarbon solvents such as n-pentane, isopentane, n-hexane, isohexane, n-heptane, isoheptane, 2,2,4-trimethyl pentane, n-octane, isooctane, cyclohexane, and methylcyclohexane;

aromatic hydrocarbon solvents such as benzene, toluene, xylene, mesitylene, ethylbenzene, trimethylbenzene, methylethylbenzene, n-propylbenzene, isopropylbenzene, diethylbenzene, isobutylbenzene, triethylbenzene, di-isopropylbenzene, and n-amylnaphthalene; and the like.

These organic solvents may be used either alone, or in combination of two or more thereof.

Other Optional Component

The other optional component which may be contained in the radiation-sensitive resin composition is exemplified by (F) a polymer containing a fluorine atom other than the polymer (A) (hereinafter, may be also referred to as "polymer (F)"), a surfactant, an acid diffusion control agent, an alicyclic skeleton-containing compound, a sensitizing agent, a crosslinking agent, and the like.

Polymer (F)

The radiation-sensitive resin composition may further contain (F) a polymer having a fluorine atom as a favorable component. When the radiation-sensitive resin composition contains the polymer (F), the radiation-sensitive composition has enhanced usability for liquid immersion lithography, due to the following positive effects: hydrophobicity of the resist film is improved; superior suppression of the elution of substances is achieved even when liquid immersion lithography is carried out; a sufficiently high receding contact angle between a resist film and a liquid immersion liquid can be achieved; and no water droplet is left during high-speed scanning exposure; and the like.

The structure of the fluorine-containing resin is not particularly limited, and the resin may be exemplified by: (1) a fluorine-containing resin that is insoluble in a developer solution itself and becomes soluble in an alkali by an action of an acid; (2) a fluorine-containing resin that is soluble in a developer solution itself and will have an increased solubility in an alkali by an action of an acid; (3) a fluorine-containing resin that is insoluble in a developer solution itself and becomes soluble in an alkali by an action of an alkali; (4) a fluorine-containing resin that is soluble in a developer solution itself and will have an increased solubility in an alkali by an action of an alkali, and the like.

The form of the polymer having a fluorine atom (F) may involve, for example:

a structure in which a fluorinated alkyl group is bonded to a main chain;

a structure in which a fluorinated alkyl group is bonded to a side chain; and a structure in which a fluorinated alkyl group is bonded to a main chain and a fluorinated alkyl group is bonded to a side chain.

A monomer that gives the structure in which a fluorinated alkyl group is bonded to a main chain is exemplified by: an α-trifluoromethyl acrylate compound; a β-trifluoromethyl acrylate compound; an α,β-trifluoromethyl acrylate compound; a compound derived by substituting hydrogen(s) of one or more types of vinyl moieties by a fluorinated alkyl group such as a trifluoromethyl group; and the like.

A monomer that gives the structure in which a fluorinated alkyl group is bonded to a side chain is exemplified by: an alicyclic olefin compound such as norbornene having a fluorinated alkyl group and/or a derivative thereof as a side chain; an ester compound of acrylic acid or methacrylic acid having a fluorinated alkyl group and/or a derivative thereof as a side chain; an olefin having a fluorinated alkyl group or a derivative thereof as one or more types of side chain (a site excluding a double bond), and the like.

A monomer that gives the structure in which a fluorinated alkyl group is bonded to a main chain and a fluorinated alkyl group is bonded to a side chain is exemplified by: an ester compound of α-trifluoromethylacrylic acid, β-trifluoromethylacrylic acid, α,β-trifluoromethylacrylic acid, etc., having a fluorinated alkyl group and/or a derivative thereof as a side chain; a compound derived by substituting hydrogen(s) of one or more types of vinyl moieties by a fluorinated alkyl group such as a trifluoromethyl group and substituting a side chain of the compound with a fluorinated alkyl group and/or a derivative thereof; an alicyclic olefin compound derived by substituting hydrogen(s) bonded to one or more types of double bonds by a fluorinated alkyl group such as a trifluoromethyl group and having a fluorinated alkyl group and/or a derivative thereof as a side chain; and the like. It is to be noted that the alicyclic olefin compound as referred to means an alicyclic compound that includes a double bond in a part of its ring.

The polymer (F) preferably has a structural unit (f1) represented by the following formula (3) and/or a structural unit (f2) represented by the formula (4), and may also have "other structural unit" excluding the structural unit (f1) and the structural unit (f2). Each structural unit will be described in detail below.

Structural Unit (f1)

The structural unit (f1) is represented by the following formula (3).

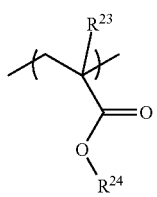

(3)

In the above formula (3), $R^{23}$ represents a hydrogen atom, a fluorine atom, a methyl group or a trifluoromethyl group; $R^{24}$ represents a linear or branched alkyl group having 1 to 6 carbon atoms and having a fluorine atom or a monovalent alicyclic hydrocarbon group having 4 to 20 carbon atoms and having a fluorine atom, wherein a part or all of hydrogen atoms of the alkyl group and the alicyclic hydrocarbon group are unsubstituted or substituted.

Examples of the linear or branched alkyl group having 1 to 6 carbon atoms include a methyl group, an ethyl group, a propyl group, a butyl group, and the like.

Examples of the monovalent alicyclic hydrocarbon group having 4 to 20 carbon atoms include a cyclopentyl group, a cyclopentylpropyl group, a cyclohexyl group, a cyclohexylmethyl group, a cycloheptyl group, a cyclooctyl group, a cyclooctylmethyl group, and the like.

Examples of the monomer that gives the structural unit (f1) include trifluoromethyl (meth)acrylate, 2,2,2-trifluoroethyl (meth)acrylate, perfluoroethyl (meth)acrylate, perfluoro n-propyl (meth)acrylate, perfluoro i-propyl (meth)acrylate, perfluoro n-butyl (meth)acrylate, perfluoro i-butyl (meth)acrylate, perfluoro t-butyl (meth)acrylate, perfluorocyclohexyl (meth)acrylate, 2-(1,1,1,3,3,3-hexafluoro)propyl (meth)acrylate, 1-(2,2,3,3,4,4,5,5-octafluoro)pentyl (meth)acrylate, 1-(2,2,3,3,4,4,5,5-octafluoro)hexyl (meth)acrylate, perfluorocyclohexylmethyl (meth)acrylate, 1-(2,2,3,3,3-pentafluoro)propyl (meth)acrylate, 1-(2,2,3,3,4,4,4-heptafluoro)butyl (meth)acrylate, 1-(3,3,4,4,5,5,6,6,7,7,8,8,9,9,10,10,10-heptadecafluoro)decyl (meth)acrylate, 1-(5-trifluoromethyl-3,3,4,4,5,6,6,6-octafluoro)hexyl (meth)acrylate, and the like.

Examples of the structural unit (f1) include structural units represented by the following formulae (3-1) and (3-2).

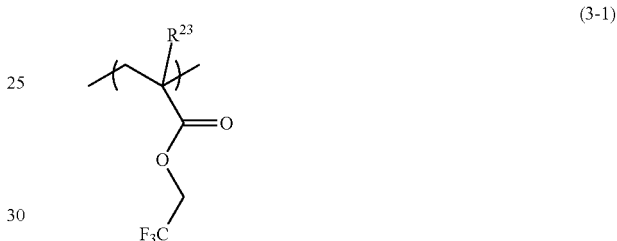

(3-1)

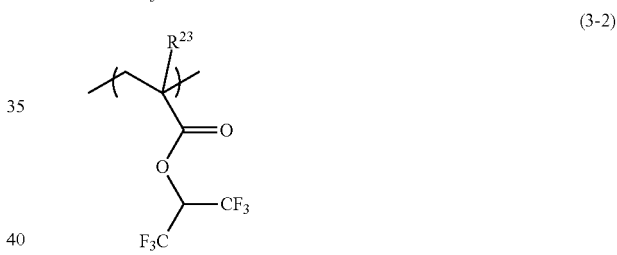

(3-2)

In the above formula (3-1) and (3-2), $R^{23}$ is as defined in the above formula (3).

In the polymer (F), the content of the structural unit (f1) is preferably 10 mol % to 70 mol %, and more preferably 20 mol % to 60 mol % with respect to the entire structural units constituting the polymer (F). It is to be noted that the polymer (F) may include one, or two or more types of the structural unit (f1).

Structural Unit (f2)

The structural unit (f2) is a structural unit represented by the following formula (4).

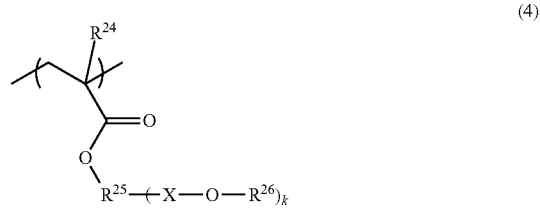

(4)

In the above formula (4), $R^{24}$ represents a hydrogen atom, a methyl group or a trifluoromethyl group; $R^{25}$ represents a linking group having a valency of (k+1); X represents a divalent linking group having a fluorine atom; $R^{26}$ represents a hydrogen atom or a monovalent organic group; k is an integer of 1 to 3, wherein, in a case where k is 2 or 3, a plurality of Xs and a plurality of $R^{26}$s are each identical or different.

In the above formula (4), the linking group having a valency of (k+1) represented by $R^{25}$ is exemplified by a linear or branched hydrocarbon group having 1 to 30 carbon atoms, an alicyclic hydrocarbon group having 3 to 30 carbon atoms, an aromatic hydrocarbon group having 6 to 30 carbon atoms, or a group derived by combining such a group with at least one group(s) selected from the set consisting of an oxygen atom, a sulfur atom, an ether group, an ester group, a carbonyl group, an imino group and an amide group. Also, the linking group having a valency of (k+1) may have a substituent.

Examples of the linear or branched hydrocarbon group having 1 to 30 carbon atoms include groups derived from any of hydrocarbons such as methane, ethane, propane, butane, pentane, hexane, heptane, decane, icosane and triacontane by removing (k+1) hydrogen atoms therefrom.

Examples of the alicyclic hydrocarbon group having 3 to carbon atoms include groups derived from any of the following hydrocarbons by removing (k+1) hydrogen atoms therefrom:

monocyclic saturated hydrocarbons such as cyclopropane, cyclobutane, cyclopentane, cyclohexane, cycloheptane, cyclooctane, cyclodecane, methylcyclohexane and ethylcyclohexane;

monocyclic unsaturated hydrocarbons such as cyclobutene, cyclopentene, cyclohexene, cycloheptene, cyclooctene, cyclodecene, cyclopentadiene, cyclohexadiene, cyclooctadiene and cyclodecadiene;

polycyclic saturated hydrocarbons such as bicyclo[2.2.1]heptane, bicyclo[2.2.2]octane, tricyclo[5.2.1.0$^{2,6}$]decane, tricyclo[3.3.1.1$^{3,7}$]decane, tetracyclo[6.2.1.1$^{3,6}$.0$^{2,7}$]dodecane and adamantane;

polycyclic hydrocarbon groups such as bicyclo[2.2.1]heptene, bicyclo[2.2.2]octene, tricyclo[5.2.1.0$^{2,6}$]decene, tricyclo[3.3.1.1$^{3,7}$]decene and tetracyclo[6.2.1.1$^{3,6}$.0$^{2,7}$]dodecene.

Examples of the aromatic hydrocarbon group having 6 to 30 carbon atoms include groups derived from any of aromatic hydrocarbons such as benzene, naphthalene, phenanthrene, anthracene, tetracene, pentacene, pyrene, picene, toluene, xylene, ethylbenzene, mesitylene and cumene by removing (k+1) hydrogen atoms therefrom.

In the above formula (4), the divalent linking group having a fluorine atom represented by X is exemplified by a divalent linear hydrocarbon group having 1 to 20 carbon atoms and having a fluorine atom. X is exemplified by structures represented by the following formulae (X-1) to (X-6), and the like.

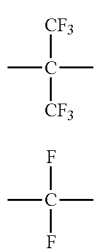

(X-1)

(X-2)

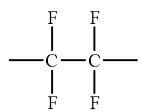

(X-3)

(X-4)

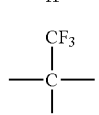

(X-5)

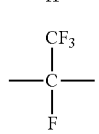

(X-6)

X preferably represents a structure represented by the above formulae (X-1) and (X-2).

In the above formula (4), the organic group represented by $R^{26}$ is exemplified by a linear or branched hydrocarbon group having 1 to 30 carbon atoms, an alicyclic hydrocarbon group having 3 to 30 carbon atoms, an aromatic hydrocarbon group having 6 to 30 carbon atoms, or a group derived by combining such a group with at least one group(s) selected from the set consisting of an oxygen atom, a sulfur atom, an ether group, an ester group, a carbonyl group, an imino group and an amide group.

Examples of the structural unit (f2) include structural units represented by the following formulae (4-1) and formula (4-2).

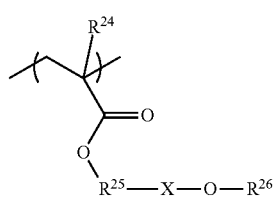

(4-1)

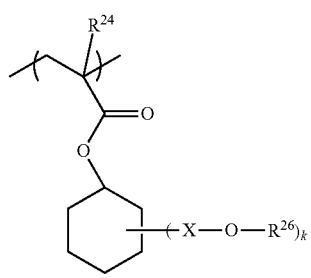

(4-2)

In the above formula (4-1), $R^{25}$ represents a linear, branched or cyclic saturated or unsaturated hydrocarbon group having 1 to 20 carbon atoms divalent. $R^{24}$, X and $R^{26}$ is as defined in the above formula (4).

In the above formula (4-2), $R^{24}$, X, $R^{26}$ and k are as defined in the above formula (4), wherein in the case where k is 2 or 3, a plurality of Xs and a plurality of $R^{26}$s are each identical or different.

The structural units represented by the above formula (4-1) and formula (4-2) is exemplified by structural units represented by the following formula (4-1-1), formula (4-1-2) and formula (4-2-1).

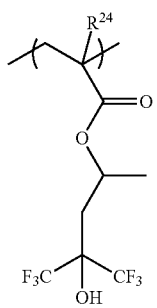
(4-1-1)

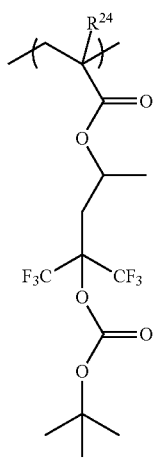
(4-1-2)

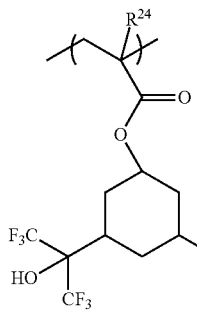
(4-2-1)

In the above formulae (4-1-1), (4-1-2) and (4-2-1), $R^{24}$ is as defined in the above formula (4).

Examples of the monomer that gives the structural unit (f2) include (meth)acrylic acid (1,1,1-trifluoro-2-trifluoromethyl-2-hydroxy-3-propyl) ester, (meth)acrylic acid (1,1,1-trifluoro-2-trifluoromethyl-2-hydroxy-4-butyl) ester, (meth)acrylic acid (1,1,1-trifluoro-2-trifluoromethyl-2-hydroxy-5-pentyl) ester, (meth)acrylic acid (1,1,1-trifluoro-2-trifluoromethyl-2-hydroxy-4-pentyl) ester, (meth)acrylic acid 2-{[5-(1',1',1'-trifluoro-2'-trifluoromethyl-2'-hydroxy)propyl]bicyclo[2.2.1]heptyl}ester, and the like.

In the polymer (F), the content of the structural unit (f2) is preferably 20 mol % to 80 mol %, and more preferably 30 mol % to 70 mol % with respect to the entire structural units constituting the polymer (F). It is to be noted that, the polymer (F) may include one, or two or more types of the structural unit (f2).

Other Structural Unit

The polymer (F) may further have as "other structural unit" at least one structural unit that includes a lactone structure for increasing a solubility in a developer solution, and a structural unit that includes an alicyclic structure for enhancing the etching resistance. Such a structural unit that includes a lactone structure, and a structural unit that includes an alicyclic structure are exemplified by structural units similar to the structural unit that includes a lactone structure in the polymer (A).

In the polymer (F), the content of the other structural unit is typically no greater than 90 mol %, preferably no greater than 10 mol % to 80 mol %, and more preferably 20 mol % to 70 mol % with respect to the entire structural units constituting the polymer (F). It is to be noted that the polymer (F) may include one, or two or more types of the other structural unit.

The amount of the polymer (F) blended is preferably 0.1 parts by mass to 20 parts by mass, more preferably 1 part by mass to 10 parts by mass, and particularly preferably 1 part by mass to 7.5 parts by mass with respect to 100 parts by mass of the polymer (A). When the amount of the polymer (F) is less than 0.1 parts by mass, the effect achieved by adding the polymer (F) may not be sufficient. On the other hand, when the amount of the polymer (F) is greater than 20 parts by mass, water repellency of the surface of the resist is excessively increased, whereby development defects may occur.

The proportion of the fluorine atom contained in the polymer (F) is preferably greater than that of the polymer (A). The proportion of the fluorine atom contained in the polymer (F) is typically no less than 5% by mass, preferably 5% by mass to 50% by mass, and more preferably 5% by mass to 45% by mass with respect to 100% by mass of the total amount of the polymer (F). It is to be noted that the proportion of the fluorine atom contained may be determined by $^{13}$C-NMR. When the proportion of the fluorine atom contained in the polymer (F) is greater than that of the polymer (A), the water repellency of the surface of the photoresist film provided by the radiation-sensitive resin composition containing the polymer (F) and the polymer (A) can be increased, and thus a need for separately providing an upperlayer film in liquid immersion lithography can be obviated. In order to sufficiently achieve the foregoing effects, the difference between the proportion of the fluorine atom in the polymer (A), and the proportion of the fluorine atom in the polymer (F) is preferably no less than 1% by mass, and more preferably no less than 3% by mass.

Synthesis Method of Polymer (F)

The polymer (F) may be produced by, for example, polymerizing a monomer corresponding to each certain structural unit in an appropriate solvent using a radical polymerization initiator.

Examples of the solvent for use in the polymerization include:

alkanes such as n-pentane, n-hexane, n-heptane, n-octane, n-nonane and n-decane;

cycloalkanes such as cyclohexane, cycloheptane, cyclooctane, decalin and norbornane;

aromatic hydrocarbons such as benzene, toluene, xylene, ethylbenzene and cumene;

halogenated hydrocarbons such as chlorobutanes, bromohexanes, dichloroethanes, hexamethylene dibromide and chlorobenzene;

saturated carboxylate esters such as ethyl acetate, n-butyl acetate, i-butyl acetate and methyl propionate;

ketones such as acetone, 2-butanone, 4-methyl-2-pentanone and 2-heptanone;

ethers such as tetrahydrofuran, dimethoxyethanes and diethoxyethanes;

alcohols such as methanol, ethanol, 1-propanol, 2-propanol and 4-methyl-2-pentanol, and the like. These solvents may be used either alone, or in combination of two or more thereof.

The reaction temperature in the polymerization is typically 40° C. to 150° C., and preferably 50° C. to 120° C. The reaction time period is typically 1 hr to 48 hrs, and preferably 1 hr to 24 hrs.

The Mw of the polymer (F) is preferably 1,000 to 50,000, more preferably 1,000 to 40,000, and particularly preferably 1,000 to 30,000. The Mw of the polymer (F) of less than 1,000 may lead to failure in attaining a sufficient receding contact angle. On the other hand, when the Mw exceeds 50,000, developability in forming a resist is likely to be inferior.

A ratio (Mw/Mn) of the Mw to the number average molecular weight (Mn) in terms of the polystyrene equivalent as determined by a GPC method of the polymer (F) is preferably 1 to 5, and more preferably 1 to 4.

Surfactant

The surfactant has the effect of further improving coating property, striation, developability and the like. Examples of the surfactant include nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, polyethylene glycol distearate, as well as commercially available products under the trade names of KP341 (Shin-Etsu Chemical Co., Ltd.); POLYFLOW No. 75, and No. 95 (both Kyoeisha Chemical Co., Ltd.), F-top EF301, EF303, and EF352 (all Tochem Products Co. Ltd.), Megafac F171, F173 (all Dainippon Ink And Chemicals, Incorporated), Fluorad FC430, and FC431 (all Sumitomo 3M Ltd.), AsahiGuard AG710, Surflon S-382, SC-101, SC-102, SC-103, SC-104, SC-105, and SC-106 (all Asahi Glass Co., Ltd.), and the like. These surfactants may be used either alone or in combination of two or more thereof.

Acid Diffusion Control Agent

The radiation-sensitive resin composition according to the embodiment of the present invention may further contain an acid diffusion control agent. The acid diffusion control agent controls a phenomenon of diffusion of an acid, which is generated from the acid generating agent upon exposure, in the resist coating film, and inhibiting an undesired chemical reaction in an unexposed region. By blending such an acid diffusion control agent in the photoresist composition, the storage stability of the resulting radiation-sensitive resin composition can be further improved and the resolution as a resist can be further improved. In addition, an alteration of line width of the resist pattern due to varying post-exposure delay (PED) from the exposure to the heat treatment after the exposure can be prevented so that a composition that exhibits excellent process stability can be obtained.

As the acid diffusion control agent, for example, a nitrogen-containing compound having an N-t-alkoxycarbonyl group is preferably used. Specifically, compounds such as N-t-butoxycarbonyl di-n-octylamine, N-t-amyloxycarbonyl di-n-octylamine, N-t-butoxycarbonyl di-n-nonylamine, N-t-amyloxycarbonyl di-n-nonylamine, N-t-butoxycarbonyl di-n-decylamine, N-t-amyloxycarbonyl di-n-decylamine, N-t-butoxycarbonyl dicyclohexylamine, N-t-amyloxycarbonyl dicyclohexylamine, N-t-butoxycarbonyl-1-adamantylamine, N-t-amyloxycarbonyl-1-adamantylamine, N-t-butoxycarbonyl-2-adamantylamine, N-t-amyloxycarbonyl-2-adamantylamine, N-t-butoxycarbonyl-N-methyl-1-adamantylamine, N-t-amyloxycarbonyl-N-methyl-1-adamantylamine, (S)-(−)-1-(t-butoxycarbonyl)-2-pyrrolidinemethanol, (S)-(−)-1-(t-amyloxycarbonyl)-2-pyrrolidinemethanol, (R)-(+)-1-(t-butoxycarbonyl)-2-pyrrolidinemethanol, (R)-(+)-1-(t-amyloxycarbonyl)-2-pyrrolidinemethanol, N-t-butoxycarbonyl-4-hydroxypiperidine, N-t-amyloxycarbonyl-4-hydroxypiperidine, N-t-butoxycarbonylpyrrolidine, N-t-amyloxycarbonylpyrrolidine, N,N'-di-t-butoxycarbonylpiperazine, N,N'-di-t-amyloxycarbonylpiperazine, N,N-di-t-butoxycarbonyl-1-adamantylamine, N,N-di-t-amyloxycarbonyl-1-adamantylamine, N-t-butoxycarbonyl-4,4'-diaminodiphenylmethane, N-t-amyloxycarbonyl-4,4'-diaminodiphenylmethane, N,N'-di-t-butoxycarbonyl hexamethylenediamine, N,N'-di-t-amyloxycarbonyl hexamethylenediamine, N,N,N',N'-tetra-t-butoxycarbonyl hexamethylenediamine, N,N,N',N'-tetra-t-amyloxycarbonyl hexamethylenediamine, N,N'-di-t-butoxycarbonyl-1,7-diaminoheptane, N,N'-di-t-amyloxycarbonyl-1,7-diaminoheptane, N,N'-di-t-butoxycarbonyl-1,8-diaminooctane, N,N'-di-t-amyloxycarbonyl-1,8-diaminooctane, N,N'-di-t-butoxycarbonyl-1,9-diaminononane, N,N'-di-t-amyloxycarbonyl-1,9-diaminononane, N,N'-di-t-butoxycarbonyl-1,10-diaminodecane, N,N'-di-t-amyloxycarbonyl-1,10-diaminodecane, N,N'-di-t-butoxycarbonyl-1,12-diaminododecane, N,N'-di-t-amyloxycarbonyl-1,12-diaminododecane, N,N'-di-t-butoxycarbonyl-4,4'-diaminodiphenylmethane, N,N'-di-t-amyloxycarbonyl-4,4'-diaminodiphenylmethane, N-t-butoxycarbonyl benzimidazole, N-t-butoxycarbonyl benzimidazole, N-t-amyloxycarbonyl-2-methylbenzimidazole, N-t-butoxycarbonyl-2-phenylbenzimidazole and N-t-amyloxycarbonyl-2-phenylbenzimidazole are exemplified.

In addition, as the acid diffusion control agent, a nitrogen-containing compound such as, for example, a tertiary amine compound, a quaternary ammonium hydroxide compound, as well as other nitrogen-containing heterocyclic compound may be used in addition to the compounds described above.

Examples of the tertiary amine compound include:

tri(cyclo)alkylamines such as triethylamine, tri-n-propylamine, tri-n-butylamine, tri-n-pentylamine, tri-n-hexylamine, tri-n-heptylamine, tri-n-octylamine, cyclohexyl dimethylamine, dicyclohexylmethylamine and tricyclohexylamine;

aromatic amines such as aniline, N-methylaniline, N,N-dimethylaniline, 2-methylaniline, 3-methylaniline, 4-methylaniline, 4-nitroaniline, 2,6-dimethylaniline and 2,6-diisopropylaniline;

alkanolamines such as triethanolamine, N,N-di(hydroxyethyl)aniline;

N,N,N',N'-tetramethylethylenediamine, N,N,N',N'-tetrakis(2-hydroxypropyl)ethylenediamine, 1,3-bis[1-(4-aminophenyl)-1-methylethyl]benzenetetramethylenediamine, bis(2-dimethylaminoethyl)ether, bis(2-diethylaminoethyl) ether, and the like.

Examples of the quaternary ammonium hydroxide compound include tetra-n-propylammonium hydroxide, tetra-n-butylammonium hydroxide, and the like.

Moreover, as the acid diffusion control agent, an onium salt compound that loses basicity as an acid diffusion controlling property upon exposure by degradation may be also used. Specific examples of the onium salt compound include sulfonium salt compounds represented by the following formula (5-1), and iodonium salt compounds represented by the following formula (5-2).

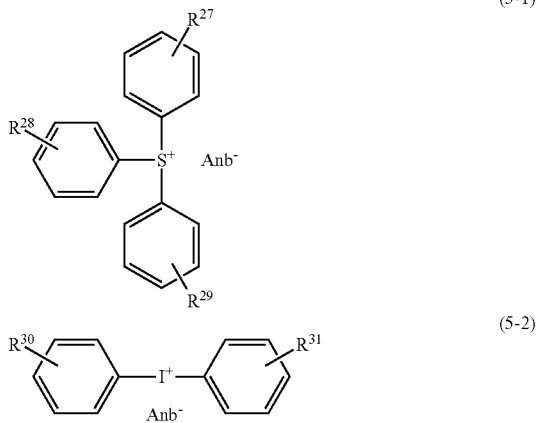

$R^{27}$ to $R^{31}$ in the above formula (5-1) and formula (5-2) each independently represent a hydrogen atom, an alkyl group, an alkoxyl group, a hydroxyl group, or a halogen atom.

Furthermore, Anb⁻ represents OH⁻, $R^{32}$—COO⁻, $R^{32}$—$SO_3^-$ (wherein, $R^{32}$ each independently represents an alkyl group, an aryl group, or an alkanol group), or an anion represented by the following formula (6).

Specific examples of the sulfonium salt compound and the iodonium salt compound include triphenylsulfonium hydroxide, triphenylsulfonium acetate, triphenylsulfonium salicylate, diphenyl-4-hydroxyphenylsulfonium hydroxide, diphenyl-4-hydroxyphenylsulfonium acetate, diphenyl-4-hydroxyphenylsulfonium salicylate, bis(4-t-butylphenyl)iodonium hydroxide, bis(4-t-butylphenyl)iodonium acetate, bis(4-t-butylphenyl)iodonium hydroxide, bis(4-t-butylphenyl)iodonium acetate, bis(4-t-butylphenyl)iodonium salicylate, 4-t-butylphenyl-4-hydroxyphenyliodonium hydroxide, 4-t-butylphenyl-4-hydroxyphenyliodonium acetate, 4-t-butylphenyl-4-hydroxyphenyliodonium salicylate, bis(4-t-butylphenyl)iodonium 10-camphorsulfonate, diphenyliodonium 10-camphorsulfonate, triphenylsulfonium 10-camphorsulfonate, 4-t-butoxyphenyl diphenylsulfonium 10-camphorsulfonate, and the like.

The acid diffusion control agent may be used alone of one type or as a mixture of two or more thereof. The proportion of the acid diffusion control agent contained is preferably 10 parts by mass, and more preferably no less than 0.1 parts by mass and no greater than 8 parts by mass with respect to 100 parts by mass of the polymer (A). When the amount used exceeds 10 parts by mass, sensitivity as a resist is likely to be decreased. When the total amount used exceeds 10 parts by mass, the sensitivity as a resist is likely to be significantly decreased.

Alicyclic Skeleton-Containing Compound

The alicyclic skeleton-containing compound achieves an effect of improving dry etching resistance, pattern configuration, adhesiveness to a substrate, and the like.

Examples of the alicyclic skeleton-containing compound include:

adamantane derivatives such as 1-adamantane carboxylic acid, 2-adamantanone and t-butyl 1-adamantane carboxylate;

deoxycholic acid esters such as t-butyl deoxycholate, t-butoxycarbonylmethyl deoxycholate and 2-ethoxyethyl deoxycholate;

lithocholic acid esters such as t-butyl lithocholate, t-butoxycarbonylmethyl lithocholate and 2-ethoxyethyl lithocholate;

3-[2-hydroxy-2,2-bis(trifluoromethyl)ethyl]tetracyclo[4.4.0.1$^{2,5}$.1$^{7,10}$]dodecane, 2-hydroxy-9-methoxycarbonyl-5-oxo-4-oxa-tricyclo[4.2.1.0$^{3,7}$]nonane, and the like. These alicyclic skeleton-containing compounds may be used either alone, or in combination of two or more thereof.

Sensitizing Agent

The sensitizing agent exhibits an action of increasing the amount of the acid generating agent (B) produced, and thus has an effect of improving "apparent sensitivity" of the radiation-sensitive resin composition.

The sensitizing agent is exemplified by carbazoles, acetophenones, benzophenones, naphthalenes, phenols, biacetyl, eosin, rose bengal, pyrenes, anthracenes, phenothiazines, and the like. These sensitizing agent may be used either alone, or in combination of two or more thereof.

Preparation of Radiation-Sensitive Resin Composition

The radiation-sensitive resin composition can be prepared by mixing, for example, polymer (A), the acid generating agent (B) and the other component in the organic solvent (C) at a certain ratio. Also, it is possible to prepare the composition in a state of being dissolved or dispersed in an appropriate organic solvent.

The radiation-sensitive resin composition according to the embodiment of the present invention is useful as a chemically amplified type resist. In the chemically amplified positive type resist, resin component, predominantly the acid-dissociable group in the polymer (A), is dissociated due to an action of an acid generated from an acid generator upon exposure to give a polar group typified by a carboxyl group. As a result, solubility of the resist at light-exposed sites in an alkaline developer increases, whereby the light-exposed sites are dissolved in the alkaline developer and removed. Accordingly, a photoresist pattern of positive type is obtained.

In the case of negative type, inclusion of a crosslinking agent and the like, a crosslinking reaction of the crosslinking agent with an alkali-soluble resin component readily occurs due to an action of an acid generated from an acid generator upon exposure. As a result, solubility in an alkaline developer solution of the resist at light-exposed sites is decreased, and thus the light-unexposed sites are dissolved in the alkaline developer solution and removed, whereby a resist pattern is obtained. In addition, in the case of the negative type, use of an organic solvent as the developer solution, or the like enables a negative photoresist pattern to be obtained.

Hereinafter, a photoresist pattern-forming method carried out using a positive type radiation-sensitive resin composition will be described in detail.

The photoresist pattern-forming method is generally carried out according to, for example, the following procedures. A photoresist pattern can be formed by (1) using a radiation-sensitive resin composition to provide a photoresist film on a substrate (step (1)); (2) thereafter exposing the provided photoresist film by irradiating with a radioactive ray through a mask having a predetermined pattern (via a liquid immersion medium as needed) (step (2)); (3) heating the substrate (exposed photoresist film) (step (3)); and then (4) developing (step (4)).

In the step (1), the radiation-sensitive resin composition is coated on a substrate (silicon wafer, wafer covered with silicon dioxide and/or an antireflective film, etc.) by an appropriate means for coating such as spin coating, cast coating or roll coating to provide a photoresist film. Specifically, after coating a resin composition solution such that the resulting resist film has a predetermined film thickness, prebaking (PB) is carried out to evaporate a solvent in the coated film, whereby the resist film is provided.

In the step (2), the photoresist film provided in the step (1) is exposed by irradiating with a radioactive ray, as the case may be, via a liquid immersion medium such as water. In this step, the radioactive ray is irradiated through a mask having a predetermined pattern. The radioactive ray appropriately selected from visible light rays, ultraviolet rays, deep ultraviolet rays, an X-ray, charged particle rays and the like in accordance with the line width of the intended pattern may be irradiated. Of these, far ultraviolet rays typified by an ArF excimer laser (wavelength: 193 nm) and a KrF excimer laser (wavelength: 248 nm) are preferred, and an ArF excimer laser is particularly preferred.

The step (3) is referred to as post exposure baking (PEB), which is a step in which the acid generated from the acid generator deprotects the polymer at portions of the photoresist film exposed in the step (2). A difference of solubility in an alkaline developer solution occurs between exposed portions (light-exposed site) and unexposed portions (light-unexposed site). PEB is carried out at a temperature appropriately selected within the range of typically from 50° C. to 180° C.

In the step (4), the exposed photoresist film is developed with a developer solution to form a predetermined photoresist pattern. After the development, washing with water and drying generally follow. Examples of preferable developer solution include aqueous alkali solutions prepared by dissolving at least one alkaline compound such as sodium hydroxide, potassium hydroxide, sodium carbonate, sodium silicate, sodium metasilicate, ammonia water, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene or 1,5-diazabicyclo-[4.3.0]-5-nonene.

Moreover, when liquid immersion lithography is carried out, a protective film for liquid immersion that is soluble in a liquid immersion liquid may be also provided on the resist film before the step (2) in order to prevent direct contact of the liquid immersion liquid with the resist film. As the protective film for liquid immersion, any of a solvent-peelable protective film which is peeled by a solvent before the step (4) (for example, see Japanese Unexamined Patent Application, Publication No. 2006-227632), a developer solution-peelable protective film which is peeled concomitant with the development in the step (4) (for example, see WO2005-069076 and WO2006-035790) may be used. However, in light of the throughput, developer solution-peelable protective film for liquid immersion is preferably used.

The resist pattern thus obtained exhibits high resolution, and is suitable for microfabrication in which a lithography technique is used.

Polymer

The polymer according to the embodiment of the present invention includes a structural unit (I) derived from a compound represented by the above formula (1), and a structural unit (II) derived from a compound represented by the above formula (2). The polymer is similar to the polymer (A) included in the radiation-sensitive resin composition according to the embodiment of the present invention. The polymer can be used as, for example, a component of the radiation-sensitive resin composition described above, and according to such use, can improve resolving performances and the like of the composition.

$R^1$ in the above formula (1) preferably represents a chain hydrocarbon group having a valency of (a+2) that includes one or more of —CO—, —COO—, —OCO—, —O—, —NR—, —S—, —SO—, and —$SO_2$ (wherein, R represents a hydrogen atom or an organic group having 1 to 20 carbon atoms) in the skeleton chain. According to the polymer, due to having polarity at the ring structure moiety, it can be further responsible for the improvement of the resolving ability and the like when used as a component of a radiation-sensitive resin composition.

Compound

The compound according to the embodiment of the present invention is the compound represented by the above formula (1). The compound is also similar to the aforementioned monomer that gives the structural unit of the polymer (A). When the compound is used, due to having polarity at a specific ring structure moiety, the polymer (A) described above that is suitable as a component of a radiation-sensitive resin composition can be easily produced.

According to the compound, $R^1$ in the above formula (1) preferably represents a chain hydrocarbon group having a valency of (a+2) that includes one or more of —CO—, —COO—, —OCO—, —O—, —NR—, —S—, —SO—, and —$SO_2$ (wherein, R represents a hydrogen atom or an organic group having 1 to 20 carbon atoms) in the skeleton chain. Use of the compound enables the polymer (A) described having polarity at a specific ring structure moiety to be more easily produced.

EXAMPLES

Hereinafter, the present invention will be explained in more detail by way of Synthesis Examples and Examples, but the present invention is not limited to these Examples. It is to be noted that each measurement in Examples and Comparative Examples was carried out as in the following.

Measuring Method

Weight Average Molecular Weight (Mw) and Number Average Molecular Weight (Mn)

Mw and Mn were measured by gel permeation chromatography (GPC) using GPC columns manufactured by Tosoh Corporation (trade name "G2000HXL"×2, trade name "G3000HXL"×1, and trade name "G4000HXL"×1) under analysis conditions including a flow rate of 1.0 mL/min, an elution solvent of tetrahydrofuran, a column temperature of 40° C., with mono-disperse polystyrene as a standard. In addition, the dispersity index (Mw/Mn) was derived from the results of determination of the Mw and Mn.

$^{13}$C-NMR Analysis $^{13}$C-NMR analysis was carried out using trade name "JNM-EX400" manufactured by JEOL, Ltd., with deuterochloroform as a solvent for measurement.

Synthesis of Compound

Example 1

Synthesis of Compound (1-1)

To a 1 L three-necked reactor equipped with a dropping funnel and a capacitor and dried was added 13.1 g (200 mmol) of a zinc powder (manufactured by Aldrich Co.; particle size: no greater than 150 μm), and the reactor was conditioned to give an argon atmosphere. Thereafter, 240 mL of tetrahydrofuran (THF) was added thereto, and 1.9 mL (15 mmol) of chlorotrimethylsilane was added while the mixture was stirred with a magnetic stirrer, followed by stirring at 20 to 25° C. for 30 min. Thereto was added a solution prepared by dissolving 20.0 g (200 mmol) of 2-methyltetrahydrofuran-3-one in 40 mL of THF. Next, 50 mL of a solution of 34.8 g (180 mmol) of ethyl 2-(bromomethyl)acrylate in THF solution was added dropwise. Following the dropwise addition, the mixture was stirred at room temperature for 2 hrs. After the completion of the reaction was confirmed by gas chromatography, an aqueous ammonium chloride solution and ethyl acetate were added and liquid separation was carried out. The resultant organic layer was sequentially washed with water, and with saturated saline. Thereafter, the organic layer was dried and then vacuum concentrated. Subsequently, vacuum distillation was carried out to obtain 20.4 g (yield: 67%, and purity: 99%) of 6-methyl-3-methylene-1,7-dioxaspiro[4.4]nonan-2-one (compound (1-1) represented by a formula (1-1)), as a transparent oily matter.

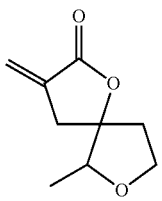

(1-1)

Physical Properties of Compound (1-1)
$^1$H-NMR (solvent for measurement: deuterochloroform; standard substance: tetramethylsilane); δ=6.27 (s, 1H), 5.67 (s, 1H), 4.05-4.25 (m, 1H), 3.90-4.05 (m, 1H), 3.80-3.90 (m, 1H), 2.80-3.20 (m, 2H), 2.00-2.45 (m, 2H), 1.10-1.25 (m, 3H).

Example 2

Synthesis of Compound (1-9)

To a 100 mL three-necked reactor equipped with a dropping funnel and a capacitor and dried was added 1.31 g (20 mmol) of a zinc powder (manufactured by Wako Pure Chemical Industries, Ltd., Wako guaranteed), and the reactor was conditioned to give an argon atmosphere. Thereafter, 20 mL of THF was added thereto, and 0.2 mL (1.6 mmol) of chlorotrimethylsilane was added while the mixture was stirred with a magnetic stirrer, followed by stirring at 20 to 25° C. for 30 min. Thereto was added a solution prepared by dissolving 2.34 g (15 mmol) of ethyl cyclopentanone-2-carboxylate in 4 mL of THF. Next, 5 mL of a solution of 3.86 g (20 mmol) of ethyl 2-(bromomethyl)acrylate in THF was added dropwise. Following the dropwise addition, the mixture was stirred at room temperature for 2 hrs. After the completion of the reaction was confirmed by gas chromatography, an aqueous ammonium chloride solution and ethyl acetate were added and liquid separation was carried out. The resultant organic layer was sequentially washed with water, and with saturated saline. Thereafter, the organic layer was dried and then vacuum concentrated. Subsequently, vacuum distillation was carried out to obtain 1.5 g (yield: 44.6%, purity: 99%) of ethyl 3-methylene-2-oxo-1-oxaspiro[4.4]nonane-6-carboxylate (compound (1-9) represented by a formula (1-9)) as a transparent oily matter.

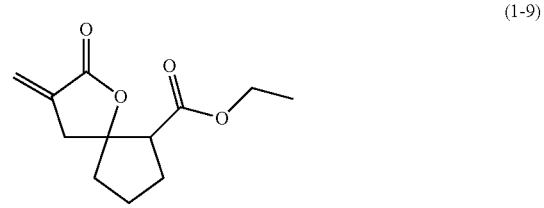 [SMILES: C=C1CC2(CCCC2C(=O)OCC)OC1=O]

(1-9)

Physical Properties of Compound (1-9)
$^1$H-NMR (solvent for measurement: deuterochloroform; standard substance: tetramethylsilane); δ=6.20 (s, 1H), 5.61 (s, 1H), 4.05-4.30 (m, 2H), 3.35-3.45 (dt, 1H), 2.94-3.08 (dt, 1H), 2.80-2.94 (t, 1H), 2.24-2.38 (m, 1H), 1.70-2.20 (m, 5H), 1.15-1.38 (t, 3H).

Example 3

Synthesis of Compound (1-12)

To a 1 L three-necked reactor equipped with a dropping funnel and a capacitor and dried was added 13.4 g (220 mmol) of a zinc powder (manufactured by Wako Pure Chemical Industries, Ltd., Wako guaranteed), and the reactor was conditioned to give a nitrogen atmosphere. Thereafter, 200 mL of THF was added thereto, and 1.9 mL (15 mmol) of chlorotrimethylsilane was added while the mixture was stirred with a magnetic stirrer, followed by stirring at 20 to 25° C. for 30 min. Thereto was added a solution prepared by dissolving 25.0 g (195 mmol) of 2-methoxycyclohexanone in 30 mL of THF. Next, 30 mL of a solution of 38.6 g (200 mmol) of ethyl 2-(bromomethyl)acrylate in THF was added dropwise. Following the dropwise addition, the mixture was stirred at room temperature for 2 hrs. After the completion of the reaction was confirmed by gas chromatography, an aqueous ammonium chloride solution and ethyl acetate were added and liquid separation was carried out. The resultant organic layer was sequentially washed with water, and with saturated saline. Thereafter, the organic layer was dried and then vacuum concentrated. Subsequently, vacuum distillation was carried out to obtain 24.1 g (yield: 63.0%, purity: 99%) of 6-methoxy-3-methylene-1-oxaspiro[4.5]decan-2-one (compound (1-12) represented by a formula (1-12)) as a transparent oily matter.

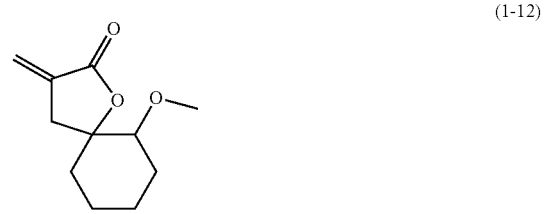

(1-12)

Physical Properties of Compound (1-12)

$^1$H-NMR (solvent for measurement: deuterochloroform; standard substance: tetramethylsilane); δ=6.15 (s, 1H), 5.53 (s, 1H), 3.00-3.50 (m, 5H), 2.46-2.58 (m, 1H), 1.90-2.10 (m, 2H), 1.76-1.86 (m, 1H), 1.58-1.76 (m, 2H), 1.42-1.58 (m, 2H), 1.22-1.38 (m, 1H).

Example 4

Synthesis of Compound (1-14)

To a 300 mL two-necked reactor was added 5.0 g (22 mmol) of a 2-hydroxycyclohexanone dimer, and thereto was added 80 ml of methylene chloride. Dissolution was permitted by stirring with a magnetic stirrer. Thereto were added 6.0 g (88 mmol) of imidazole and 0.5 g (4.4 mmol) of dimethylaminopyridine. To the mixture was added 9.9 g (66 mmol) of tert-butyldimethylsilyl chloride, and the reaction was allowed at room temperature for 6 hrs. Subsequently, an aqueous ammonium chloride solution was added and liquid separation was carried out. The resultant organic layer was sequentially washed with water, and with saturated saline. Thereafter, the organic layer was dried over magnesium sulfate, and then vacuum concentrated. Subsequently, purification was carried out with a short column to obtain 9.5 g of a crude product.

Next, to a 200 mL three-necked reactor equipped with a dropping funnel and dried was added 2.0 g (30 mmol) of a zinc powder (manufactured by Wako Pure Chemical Industries, Ltd., Wako guaranteed), and the reactor was conditioned to give a nitrogen atmosphere. Thereafter, 30 mL of tetrahydrofuran (THF) was added thereto, and 0.6 mL (5 mmol) of chlorotrimethylsilane was added while the mixture was stirred with a magnetic stirrer, followed by stirring at 20 to 25° C. for 10 min. Thereto was added a solution prepared by dissolving 5.7 g (25 mmol) of the crude product in 5 mL of THF. Next, 10 mL of a solution of 5.4 g (28 mmol) of ethyl 2-(bromomethyl)acrylate in THF was added dropwise. Following the dropwise addition, the mixture was stirred at room temperature for 2 hrs. Then an aqueous ammonium chloride solution and ethyl acetate were added and liquid separation was carried out. The resultant organic layer was sequentially washed with water, and with saturated saline. Thereafter, organic layer was dried over magnesium sulfate, and then vacuum concentrated. Subsequently, purification by column chromatography gave 5.0 g (yield: 67.0%, purity: 99%) of 6-(tert-butyldimethylsilyloxy)-3-methylene-1-oxaspiro[4.5]decan-2-one (compound (1-14) represented by a formula (1-14)) as a yellow oily matter.

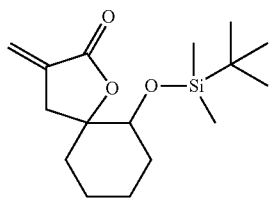

(1-14)

Physical Properties of Compound (1-14)

$^1$H-NMR (solvent for measurement: deuterochloroform; standard substance: tetramethylsilane); δ=6.1-6.2 (m, 1H), 5.45-5.58 (m, 1H), 3.44-3.74 (m, 1H), 2.86-3.17 (m, 1H), 2.42-2.58 (m, 1H), 1.22-2.00 (m, 8H), 0.76-1.00 (m, 9H), 0.02-0.09 (m, 6H).

Example 5

Synthesis of Compound (1-13)

To a dried 300 mL three-necked reactor was added 4.0 g (13.5 mmol) of the compound (1-14), and 100 mL of tetrahydrofuran (THF) was added thereto. Tetrabutylammonium fluoride in an amount of 10.6 g (40.5 mmol) was added thereto while the mixture was stirred with a magnetic stirrer, followed by stirring the mixture at room temperature for 2 hrs. Next, 100 mL of ethyl acetate was added thereto, and the organic layer was sequentially washed with a 1 M aqueous hydrochloric acid solution, water, and then saturated saline. Thereafter, the organic layer was dried over magnesium sulfate. After vacuum concentration, the crude product thus obtained was purified by column chromatography to give 1.7 g (yield: 69.1%, purity: 99%) of 6-hydroxy-3-methylene-1-oxaspiro[4.5]decan-2-one (compound (1-13) represented by a formula (1-13)) as a yellow oily matter.

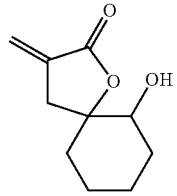

(1-13)

Physical Properties of Compound (1-13)

$^1$H-NMR (solvent for measurement: deuterochloroform; standard substance: tetramethylsilane); δ=6.22 (t, 1H), 5.62 (dt, 1H), 3.44-3.86 (m, 1H), 3.08-3.20 (m, 1H), 2.52-2.62 (m, 1H), 1.30-2.02 (m, 8H).

Example 6

Synthesis of Compound (1-15)

To a 1 L three-necked reactor equipped with a dropping funnel and a capacitor and dried was added 11.1 g (170 mmol) of a zinc powder (manufactured by Wako Pure Chemical Industries, Ltd., Wako guaranteed), and the reactor was conditioned to give a nitrogen atmosphere. Thereafter, 100 mL of tetrahydrofuran (THF) was added thereto, and 1.3 mL (10 mmol) of chlorotrimethylsilane was added while the mixture was stirred with a magnetic stirrer, followed by stirring at 20 to 25° C. for 30 min. Thereto was added a solution prepared by dissolving 23.4 g (150 mmol) of 1,4-cyclohexanedionemonoethylene ketal in 100 mL of THF. Next, 50 mL of a solution of 30.9 g (160 mmol) of ethyl 2-(bromomethyl)acrylate in THF was added dropwise. Following the dropwise addition, the mixture was stirred at room temperature for 2 hrs. After the completion of the reaction was confirmed by gas chromatography, the mixture was added dropwise into pure water and stirred for 1 hour as is to allow salts to be precipitated. The resulting salts were removed by vacuum filtration, and ethyl acetate was added to the solution obtained, followed by subjecting to liquid separation. The resultant organic layer was washed with water. Thereafter, the organic layer was dried and then vacuum concentrated to generate a solid. The solid was subjected to recrystallization using ethyl acetate as a solvent to give 15.1 g (yield: 44.9%, purity: 98%) of 3-methylene-1,9,12-trioxadispiro[4.2.4.2]tetradecan-2-one (compound (1-15) represented by a formula (1-15)) as a transparent solid.

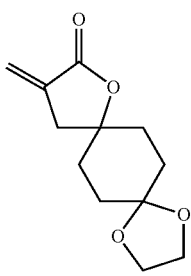

(1-15)

Physical Properties of Compound (1-15)

$^1$H-NMR (solvent for measurement: deuterochloroform; standard substance: tetramethylsilane); δ=6.24 (s, 1H), 5.63 (s, 1H), 3.90-4.10 (m, 4H), 2.76 (S, 2H), 1.75-2.10 (m, 6H), 1.60-1.75 (m, 2H).

Example 7

Synthesis of Compound (1-71)

Synthesis of (Fr-A)

Into a 20 L reactor was added 1,004 g (8.64 mol) of 1,4-cyclohexanediol, and 4,320 mL of THF was added thereto, followed by stirring with a mechanical stirrer. To the reactor was added 21.71 g (86.39 mmol) of pyridinium p-toluenesulfonate, and was subsequently added 726.73 g (8.64 mol) of 3,4-dihydro-2H-pyran. The reaction was allowed at room temperature for 12 hrs. Thereafter, 17.28 g (170.77 mmol) of triethylamine was added to stop the reaction, and the mixture was concentrated. The concentrated liquid was subjected to liquid separation using hexane and water, and NaCl was added to the water layer thus obtained until the mixture was saturated with NaCl. Subsequently, extraction with methylene chloride was carried out. After the resultant organic layer was dried over magnesium sulfate, vacuum concentration gave 737 g (3.68 mol, yield: 43%) of (Fr-A).

$^1$H-NMR data of the obtained (Fr-A) are shown below. $^1$H-NMR (solvent for measurement: deuterochloroform; standard substance: tetramethylsilane) δ: 1.24-1.91 (m, 13H), 1.94-2.05 (m, 2H), 3.45-3.53 (m, 1H), 3.59-3.70 (m, 1H), 3.71-3.78 (m, 1H), 3.87-3.95 (m, 1H), 4.67-4.71 (m, 1H)

(Fr-A)

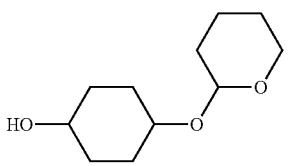

Synthesis of (Fr-B)

To a 5 L three-necked reactor was added 300 g (1.5 mol) of (Fr-A) obtained above, and 1,200 mL of methylene chloride, 0.228 g (1.5 mmol) of 1-methyl-2-azaadamantan-N-oxyl, 17.85 g (150 mmol) of potassium bromide and 450 mL of a saturated aqueous sodium bicarbonate solution were sequentially added thereto. The mixture was stirred with a mechanical stirrer, and the reactor was cooled to 0° C., to which a solution prepared by mixing 1,913 g of a 7% aqueous sodium hypochlorite solution and 450 mL of a saturated aqueous sodium bicarbonate solution was added dropwise over 3 hrs. After completing the dropwise addition, the mixture was stirred at 0° C. for 30 min, and 100 mL of a saturated aqueous sodium thiosulfate solution was added to stop the reaction and liquid separation was carried out. The resultant organic layer was washed with saturated saline, and was dried over magnesium sulfate, followed by subjecting to vacuum concentration to give 214 g (1.07 mol, yield: 71%) of (Fr-B).

$^1$H-NMR data of the obtained (Fr-B) are shown below. $^1$H-NMR (solvent for measurement: deuterochloroform; standard substance: tetramethylsilane) δ: 1.51-2.16 (m, 10H), 2.22-2.35 (m, 2H), 2.50-2.69 (m, 2H), 3.49-3.56 (m, 1H), 3.88-3.95 (m, 1H), 4.05-4.11 (m, 1H), 4.74-4.78 (m, 1H)

(Fr-B)

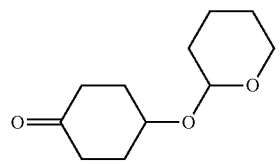

Synthesis of (1-71)

To a 3 L three-necked reactor equipped with a dropping funnel and a capacitor and dried was added 94.1 g (1.44 mol) of a zinc powder (manufactured by Wako Pure Chemical Industries, Ltd., Wako guaranteed), and the reactor was conditioned to give a nitrogen atmosphere. Thereafter, 1.3 L of tetrahydrofuran (THF) was added thereto, and while the mixture was stirred with a magnetic stirrer, and 6.3 mL (50 mmol) of chlorotrimethylsilane was added, followed by stirring the mixture at 20 to 25° C. for 10 min. Thereto was added a solution prepared by dissolving 199.3 g (1.0 mol) of Fr-B obtained above in 100 mL of THF. Next, a solution of 231.7 g (1.2 mol) of ethyl 2-(bromomethyl)acrylate in 100 mL of THF was charged into a dropping funnel at 25° C. and dropwise addition was started. Following the dropwise addition for 3 min, the temperature of the reaction liquid rose to 40° C.; therefore, the reactor was cooled in a water bath. Subsequently, dropwise addition was carried out such that the reaction temperature is maintained to fall within the range of 30 to 40° C. Two hrs were required until the completion of the dropwise addition. Thereafter, the mixture was stirred for 30 min. After the completion of the reaction was confirmed by gas chromatography, the reaction liquid was cooled. Subsequently, 1 L of a saturated aqueous ammonium chloride solution was added thereto, and mixed. The mixture was stirred as is for 1 hr and the reaction was stopped. The salt thus generated, and the generated salt and excess zinc not used by the reaction were removed by filtration through Celite. Thus resulting solution was concentrated using an evaporator to remove the organic solvent. Ethyl acetate and a saturated aqueous sodium bicarbonate solution were added to the concentrated liquid while stirring the mixture, whereby a white precipitate was formed. Thus, the white precipitate was removed by filtration, and thereafter the organic layer was fractionated by a separatory funnel. The resultant organic layer was dried and then vacuum concentrated. The solid was subjected to recrystallization using ethyl acetate as a solvent to give 254 g of a compound (1-71) represented by a formula (1-71) (yield: 95.4%, purity: 98%) as a transparent liquid.

(1-71)

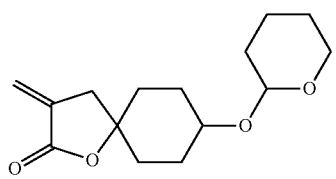

¹H-NMR data are shown below.
¹H-NMR (solvent for measurement: deuterochloroform; standard substance: tetramethylsilane) δ: 1.51-2.17 (m, 14H), 2.72 (dt, J=8.8, 2.8 Hz, 2H), 3.52-3.47 (m, 1H), 3.67-3.75 (m, 1H), 3.85-3.95 (m, 1H), 4.65 (t, J=3.6 Hz, 0.5H), 4.73 (t, J=3.6 Hz, 0.5H), 5.60-5.64 (m, 1H), 6.22-6.26 (m, 1H)

Example 8

Synthesis of (1-17)

To a 1 L reactor was added 200 g (751 mol) of the compound (1-71) obtained above, and a hydrochloric acid-methanol solution prepared by diluting 1.0 g of concentrated hydrochloric acid with 200 ml of methanol was added thereto while the mixture was stirred with a magnetic stirrer, followed by stirring at 20 to 25° C. for 30 min. After the disappearance of the raw material was confirmed by gas chromatography, a sodium bicarbonate powder was gradually added to neutralize the solution until the pH reached 7. After a salt precipitated along with the neutralization was filtered off, 500 ml of ethyl acetate was added thereto, and the organic solvent was removed by an evaporator to concentrate the product. The concentration operation was repeated twice, and then purified by column chromatography to obtain 117 g of a compound (1-17) represented by a formula (1-17) (yield 85.5%, purity 99%).

(1-17)

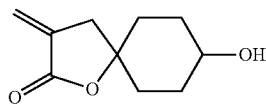

¹H-NMR data are shown below.
¹H-NMR (solvent for measurement: deuterochloroform; standard substance: tetramethylsilane) δ: 1.51-2.09 (m, 8H), 2.72 (t, J=2.8 Hz, 1H), 2.76 (t, J=2.8 Hz, 1H), 3.67-3.77 (m, 0.5H), 3.96-4.04 (m, 0.5H), 5.62-5.68 (m, 1H), 6.22-6.28 (m, 1H)

Synthesis of Polymer (A)

Monomers used in synthesis of the polymer of each Example (compound (M-1) to compound (M-21), compound (1-1), compound (1-12), compound (1-13), compound (1-15), compound (1-17) and compound (1-71) are as in the following.

(M-1)

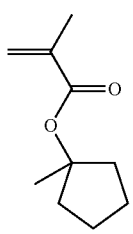

(M-2)

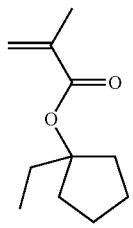

(M-3)

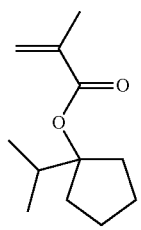

(M-4)

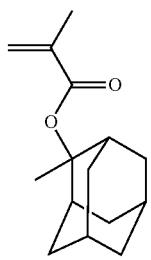

(M-5)

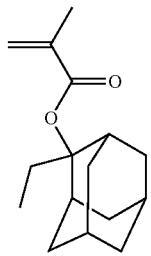

(M-6)

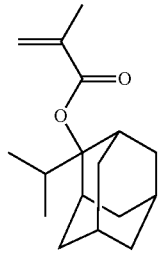

(M-7)

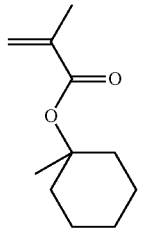

(M-8) 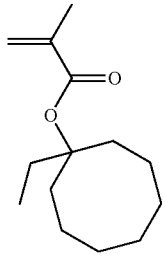
(M-9) 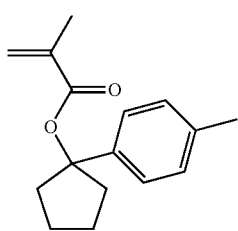
(M-10) 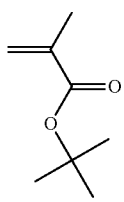
(M-11) 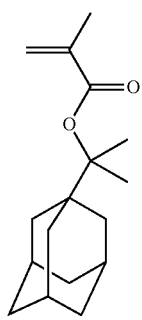
(M-12) 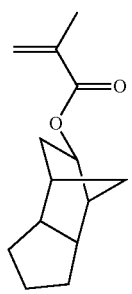
(M-13) 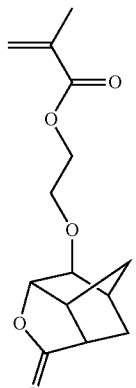
(M-14) 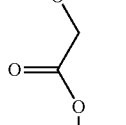
(M-15) 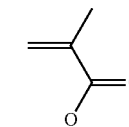
(M-16) 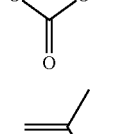
(M-17) 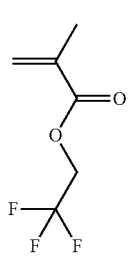

-continued (M-18)

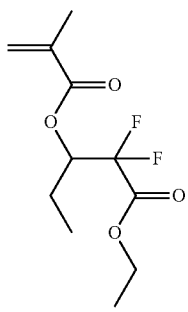

(M-19)

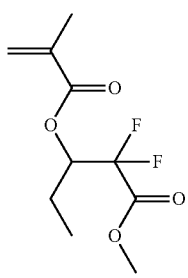

(M-20)

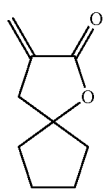

(M-21)

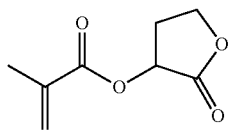

(1-1)

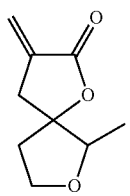

(1-12)

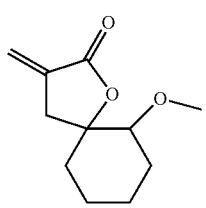

(1-13)

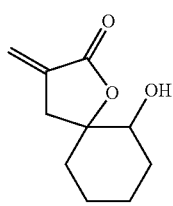

-continued (1-15)

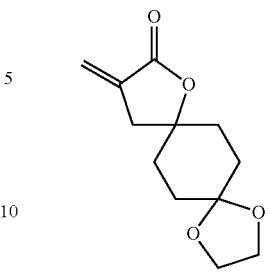

(1-71)

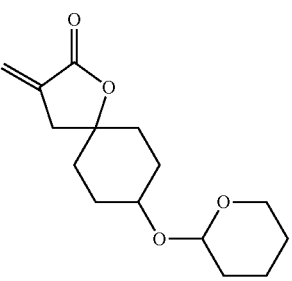

(1-17)

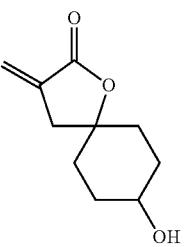

Example 9

Synthesis of Polymer (A-1)

A monomer solution was prepared by dissolving 20.0 g (50 mol %) of the compound (M-1) and 20.0 g (50 mol %) of the compound (1-1) in 80 g of 2-butanone, and then adding thereto 1.95 g of AIBN. After a 200 mL three-necked flask charged with 40 g of 2-butanone was purged with nitrogen for 30 min, the liquid was heated to 80° C. while stirring, and thereto was added dropwise the prepared monomer solution using a dropping funnel over 3 hrs. The time when dropwise addition was started was assumed to be a start time point of the polymerization reaction, and the polymerization reaction was carried out for 6 hrs. After completion of the polymerization reaction, the polymerization solution was cooled with water to a temperature of no greater than 30° C. The cooled polymerization solution was charged into 800 g of methanol, and a white powder thus precipitated was filtered off. After the filtered white powder was washed with 160 g of methanol twice, filtration and drying at 50° C. for 17 hrs gave a white powdery polymer (resin (A-1)) (20.8 g; yield: 52%). The polymer (A-1) thus obtained had an Mw of 5,730, and the Mw/Mn of 1.58.

Examples 10 to 30 and Comparative Synthesis Example 1

Synthesis of Polymers (A-2) to (A-22) and Polymer (a-1)

Each of polymers (A-2) to (A-22) of Examples 10 to 30, and polymer (a-1) of Comparative Synthesis Example 1 were obtained in a similar manner to Example 9 except that the monomer of the type and amount shown in Tables 1-1 and 1-2 was used. The yield, Mw and Mw/Mn of each monomer thus obtained are shown in Tables 1-1 and 1-2.

TABLE 1-1

| | (A) Polymer | Monomer | | | | | | | | | | | |
|---|---|---|---|---|---|---|---|---|---|---|---|---|---|
| | | M-1 | M-2 | M-3 | M-4 | M-5 | M-6 | M-7 | M-8 | M-10 | M-11 | M-12 | M-13 |
| Example 9 | A-1 | 50 | — | — | — | — | — | — | — | — | — | — | — |
| Example 10 | A-2 | — | 35 | — | 15 | — | — | — | — | — | — | — | — |
| Example 11 | A-3 | — | — | 35 | — | 15 | — | — | — | — | — | — | — |
| Example 12 | A-4 | — | — | 35 | — | — | 35 | — | — | — | — | — | — |
| Example 13 | A-5 | — | — | — | 50 | — | — | — | — | — | — | — | 20 |
| Example 14 | A-6 | 20 | — | — | — | 40 | — | — | — | — | — | — | — |
| Example 15 | A-7 | — | — | 20 | — | — | — | — | 30 | — | — | — | — |
| Example 16 | A-8 | — | — | — | — | — | — | — | 45 | — | — | 10 | — |
| Example 17 | A-9 | — | — | — | — | 20 | — | — | — | 30 | — | — | — |
| Example 18 | A-10 | — | — | — | 15 | — | — | — | — | — | 35 | — | — |
| Example 19 | A-11 | — | — | 40 | — | — | — | — | — | — | 20 | — | — |
| Example 20 | A-12 | — | 40 | — | — | — | — | — | — | — | — | 10 | — |

| | Monomer | | | | | | | | | Evaluation | | |
|---|---|---|---|---|---|---|---|---|---|---|---|---|
| | M-14 | M-15 | M-16 | M-20 | M-21 | 1-1 | 1-12 | 1-13 | 1-15 | yield (%) | Mw | Mw/Mn |
| Example 9 | — | — | — | — | — | 50 | — | — | — | 52 | 5,730 | 1.48 |
| Example 10 | — | — | — | — | — | 50 | — | — | — | 63 | 7,630 | 1.58 |
| Example 11 | — | — | — | — | — | 50 | — | — | — | 59 | 7,650 | 1.50 |
| Example 12 | — | — | — | — | — | 30 | — | — | — | 67 | 7,370 | 1.63 |
| Example 13 | — | — | 20 | — | — | 10 | — | — | — | 68 | 6,850 | 1.53 |
| Example 14 | — | — | — | — | — | 40 | — | — | — | 71 | 6,370 | 1.52 |
| Example 15 | — | — | — | — | — | 50 | — | — | — | 69 | 8,490 | 1.59 |
| Example 16 | — | — | — | — | — | 45 | — | — | — | 62 | 7,390 | 1.48 |
| Example 17 | — | — | — | — | — | 50 | — | — | — | 74 | 8,510 | 1.60 |
| Example 18 | — | — | — | — | — | 50 | — | — | — | 69 | 8,330 | 1.61 |
| Example 19 | — | — | — | — | — | 40 | — | — | — | 62 | 8,450 | 1.58 |
| Example 20 | — | — | — | — | — | 50 | — | — | — | 65 | 7,270 | 1.55 |

TABLE 1-2

| | (A) Polymer | Monomer | | | | | | | | | | | |
|---|---|---|---|---|---|---|---|---|---|---|---|---|---|
| | | M-1 | M-2 | M-3 | M-4 | M-5 | M-6 | M-7 | M-8 | M-10 | M-11 | M-12 | M-13 |
| Example 21 | A-13 | — | 20 | — | 30 | — | — | — | — | — | — | — | 20 |
| Example 22 | A-14 | — | — | 35 | — | — | 15 | — | — | — | — | — | — |
| Example 23 | A-15 | — | — | 40 | — | — | — | — | — | — | — | — | — |
| Example 24 | A-16 | — | — | — | — | 35 | — | — | — | — | — | — | — |
| Example 25 | A-17 | — | — | — | — | 35 | — | — | — | — | — | — | — |
| Example 26 | A-18 | — | — | — | — | 35 | — | — | — | — | — | — | — |
| Example 27 | A-19 | 35 | — | — | — | — | 15 | — | — | — | — | — | — |
| Example 28 | A-20 | 35 | — | — | — | — | 15 | — | — | — | — | — | — |
| Example 29 | A-21 | 35 | — | — | — | — | 15 | — | — | — | — | — | — |
| Example 30 | A-22 | 35 | — | — | — | — | 15 | — | — | — | — | — | — |
| Comparative Synthesis Example 1 | a-1 | 50 | — | — | — | — | — | — | — | — | — | — | — |

| | Monomer | | | | | | | | | Evaluation | | |
|---|---|---|---|---|---|---|---|---|---|---|---|---|
| | M-14 | M-15 | M-16 | M-20 | M-21 | 1-1 | 1-12 | 1-13 | 1-15 | yield (%) | Mw | Mw/Mn |
| Example 21 | — | — | — | — | — | 30 | — | — | — | 58 | 7,750 | 1.56 |
| Example 22 | 25 | — | — | — | — | 25 | — | — | — | 57 | 5,870 | 1.53 |
| Example 23 | — | 20 | 10 | — | — | 30 | — | — | — | 59 | 6,110 | 1.54 |
| Example 24 | — | — | 45 | — | — | 20 | — | — | — | 52 | 6,370 | 1.52 |
| Example 25 | — | 45 | — | — | — | 20 | — | — | — | 53 | 6,740 | 1.52 |
| Example 26 | — | — | — | — | 45 | 20 | — | — | — | 49 | 6,610 | 1.53 |
| Example 27 | — | — | 40 | — | — | 10 | — | — | — | 48 | 5,830 | 1.50 |
| Example 28 | — | — | 40 | — | — | — | 10 | — | — | 53 | 5,500 | 1.49 |
| Example 29 | — | — | 40 | — | — | — | — | 10 | — | 50 | 5,320 | 1.50 |
| Example 30 | — | — | 40 | — | — | — | — | — | 10 | 57 | 5,320 | 1.50 |
| Comparative Synthesis Example 1 | — | — | — | 50 | — | — | — | — | — | 63 | 5,270 | 1.45 |

Example 31

Synthesis of Polymer (A-23)

A monomer solution was prepared by dissolving 15.5 g (50 mol %) of the compound (M-1) and 24.5 g (50 mol %) of the compound (1-71) in 80 g of 2-butanone, and then adding thereto 1.51 g of AIBN. After a 200 mL three-necked flask charged with 40 g of 2-butanone was purged with nitrogen for 30 min, the liquid was heated to 80° C. while stirring, and thereto was added dropwise the prepared monomer solution using a dropping funnel over 3 hrs. The time when dropwise addition was started was assumed to be a start time point of the polymerization reaction, and the polymerization reaction was carried out for 6 hrs. After completion of the polymerization reaction, the polymerization solution was cooled with water to a temperature of no greater than 30° C. The cooled polymerization solution was charged into 800 g of methanol, and a white powder thus precipitated was filtered off. After the filtered white powder was washed with 160 g of methanol twice, filtration and drying at 50° C. for 17 hrs gave a white powdery polymer (resin (A-23)) (27.2 g; yield: 68%). The polymer (A-23) thus obtained had an Mw of 5,870, and the Mw/Mn of 1.53.

Examples 32 to 34

Synthesis of Polymers (A-24) to (A-26)

Each of polymers (A-24) to (A-26) of Examples 32 to 34 was obtained in a similar manner to Example 31 except that the monomer of the type and amount shown in Table 2 was used.

Example 35

Synthesis of Polymer (A-27)

A monomer solution was prepared by dissolving 19.1 g (50 mol %) of the compound (M-3), 3.6 g (10 mol %) of the compound (1-17) and 17.3 g (40 mol %) of the compound (M-16) in 80 g of 2-butanone, and then adding thereto 1.60 g of AIBN. After a 300 mL three-necked flask charged with 40 g of 2-butanone was purged with nitrogen for 30 min, the liquid was heated to 80° C. while stirring, and thereto was added dropwise the prepared monomer solution using a dropping funnel over 3 hrs. The time when dropwise addition was started was assumed to be a start time point of the polymerization reaction, and the polymerization reaction was carried out for 6 hrs. After completion of the polymerization reaction, the polymerization solution was cooled with water to a temperature of no greater than 30° C. The cooled polymerization solution was charged into 800 g of a mixed solution of methanol and pure water having a ratio of methanol/pure water being 8/2, and a white powder thus precipitated was filtered off. After the filtered white powder was washed with 160 g of methanol twice, filtration and drying at 50° C. for 17 hrs gave a white powdery polymer (resin (A-27)) (29.6 g; yield: 74%). The polymer (A-27) thus obtained had an Mw of 6,210, and the Mw/Mn of 1.57.

Example 36

Synthesis of Polymer (A-28)

A polymer (A-28) of Example 36 was obtained in a similar manner to Example 35 except that the monomer of the type and amount shown in Table 2 was used.

The yield, the Mw and the Mw/Mn of each resulting polymer are shown in Table 2.

TABLE 2

| (A) Polymer | | Monomer | | | | | | | | | | |
|---|---|---|---|---|---|---|---|---|---|---|---|---|
| | | M-1 | M-2 | M-3 | M-4 | M-5 | M-6 | M-7 | M-8 | M-10 | M-11 | M-12 |
| Example 31 | A-23 | 50 | — | — | — | — | — | — | — | — | — | — |
| Example 32 | A-24 | — | 50 | — | — | — | — | — | — | — | — | — |
| Example 33 | A-25 | — | — | 35 | — | — | 15 | — | — | — | — | — |
| Example 34 | A-26 | 50 | — | — | — | — | — | — | — | — | — | — |
| Example 35 | A-27 | — | — | 50 | — | — | — | — | — | — | — | — |
| Example 36 | A-28 | — | 30 | — | — | 15 | — | — | — | — | — | — |

| | Monomer | | | | | | | | Evaluation | | |
|---|---|---|---|---|---|---|---|---|---|---|---|
| | M-13 | M-14 | M-15 | M-16 | M-20 | M-21 | 1-71 | 1-17 | yield (%) | Mw | Mw/Mn |
| Example 31 | — | — | — | — | — | — | 50 | — | 68 | 5,870 | 1.53 |
| Example 32 | — | — | — | — | — | — | 50 | — | 73 | 5,930 | 1.52 |
| Example 33 | — | — | — | — | — | — | 50 | — | 72 | 6,070 | 1.54 |
| Example 34 | — | — | — | 40 | — | — | 10 | — | 75 | 6,390 | 1.56 |
| Example 35 | — | — | — | 40 | — | — | — | 10 | 74 | 6,210 | 1.57 |
| Example 36 | — | — | — | 25 | — | — | — | 30 | 42 | 6,640 | 1.54 |

(B) Acid Generating Agent

Acid generating agents (B) used in Examples and Comparative Examples are shown below.

(B-1)

(B-2)

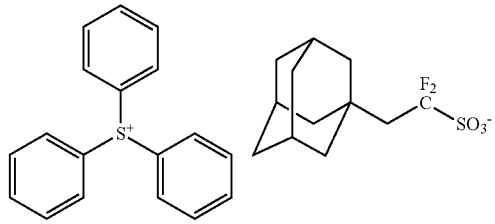

-continued
(B-3)
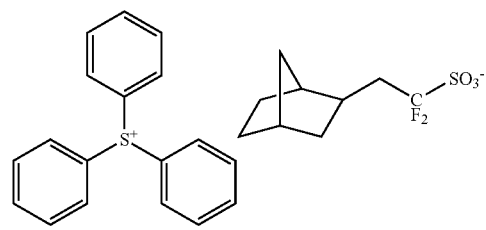
(B-4)
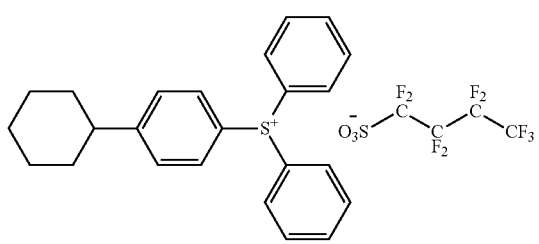
(B-5)
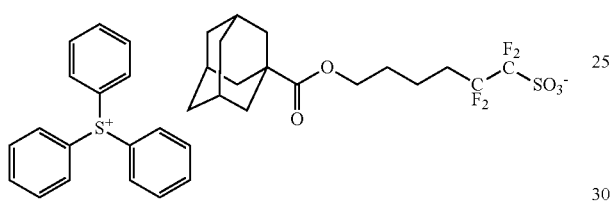
(B-6)
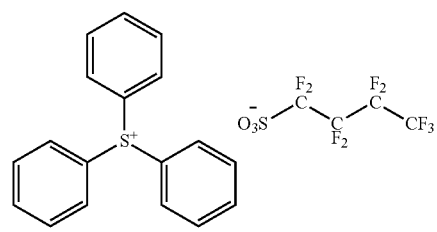
(B-7)
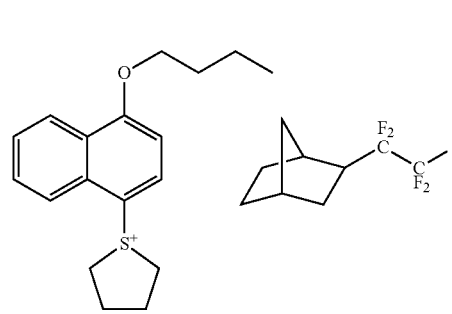
(B-8)
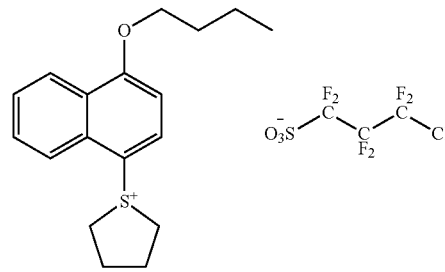
Organic Solvent (C)
Organic solvents used in Examples and Comparative Examples are shown below.
(C-1): propylene glycol monomethyl ether acetate
(C-2): cyclohexanone
(C-3): γ-butyrolactone
Acid Diffusion Control Agent
Acid diffusion control agents (D) used in Examples and Comparative Examples are shown below.
(D-1)
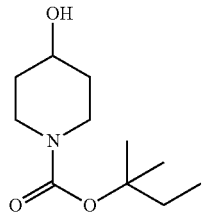
(D-2)
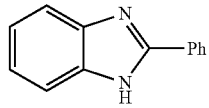
(D-3)
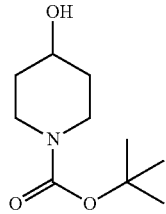
(D-4)
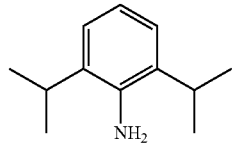
(D-5)
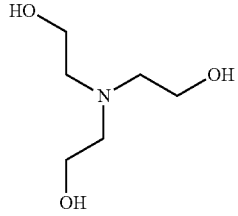
(D-6)
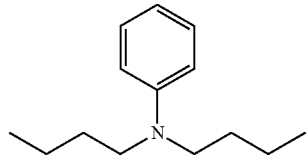
(D-7)
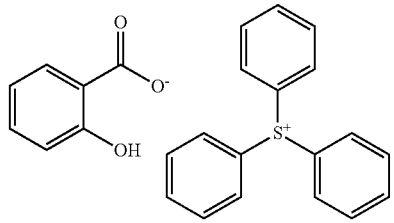

-continued

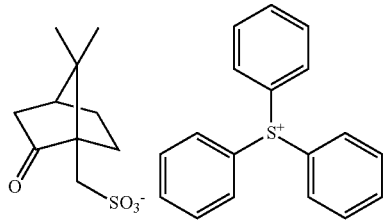

(D-8)

Synthesis of Polymer (F)

Synthesis Example 1

A monomer solution was prepared by dissolving 21.50 g (70 mol %) of the compound (M-2) and 8.50 g (30 mol %) of the compound (M-17) in 60 g of 2-butanone, and further charging 1.38 g of azobisisobutyronitrile thereto. After a 300 mL three-necked flask charged with 30 g of 2-butanone was purged with nitrogen for 30 min, the reactor was heated to 80° C. while stirring, and the monomer solution prepared as described above was added dropwise thereto using a dropping funnel over 3 hrs. The time when dropwise addition was started was assumed to be a start time point of the polymerization, and the polymerization reaction was carried out for 6 hrs.

After completion of the polymerization, the polymerization solution was cooled with water to a temperature of no greater than 30° C., and charged into 600 g of a solution of methanol and water having a ratio of methanol/water being 8/2 to allow the resin to be precipitated. After eliminating the supernatant solution, 120 g of methanol was added to the precipitated resin, and the resin was washed. Following the removal of the supernatant liquid, the resin was dried at 50° C. for 17 hrs to give a polymer (F-1) of the compounds (M-2) and (M-17) (amount of polymer: 18 g; yield: 60%). The polymer had an Mw of 5,800, the Mw/Mn of 1.41, and the content of fluorine atoms of 9.6% by mass.

Synthesis Example 2

A monomer solution was prepared by dissolving 11.22 g (40 mol %) of the compound (M-8) and 18.78 g (60 mol %) of the compound (M-18) in 60 g of 2-butanone, and further charging 1.03 g of azobisisobutyronitrile thereto. After a 300 mL three-necked flask charged with 30 g of 2-butanone was purged with nitrogen for 30 min, the reactor was heated to 80° C. while stirring, and the monomer solution prepared as described above was added dropwise thereto using a dropping funnel over 3 hrs. The time when dropwise addition was started was assumed to be a start time point of the polymerization, and the polymerization reaction was carried out for 6 hrs.

After completion of the polymerization, the polymerization solution was cooled with water to a temperature of no greater than 30° C., and charged into 600 g of a solution of methanol and water having a ratio of methanol/water being 8/2 to allow the resin to be precipitated. After eliminating the supernatant solution, 120 g of methanol was added to the precipitated resin, and the resin was washed. Following the removal of the supernatant liquid, the resin was dried at 50° C. for 17 hrs to give a polymer (F-2) of the compounds (M-8) and (M-18) (amount of polymer: 19 g; yield: 62%). The polymer had an Mw of 5,700, the Mw/Mn of 1.42, and the content of fluorine atoms of 9.5% by mass.

Synthesis Example 3

A monomer solution was prepared by dissolving 12.24 g (40 mol %) of the compound (M-9) and 17.76 g (60 mol %) of the compound (M-19) in 60 g of 2-butanone, and further charging 1.03 g of azobisisobutyronitrile thereto. After a 300 mL three-necked flask charged with 30 g of 2-butanone was purged with nitrogen for 30 min, the reactor was heated to 80° C. while stirring, and the monomer solution prepared as described above was added dropwise thereto using a dropping funnel over 3 hrs. The time when dropwise addition was started was assumed to be a start time point of the polymerization, and the polymerization reaction was carried out for 6 hrs.

After completion of the polymerization, the polymerization solution was cooled with water to a temperature of no greater than 30° C., and charged into 600 g of a solution of methanol and water having a ratio of methanol/water being 8/2 to allow the resin to be precipitated. After eliminating the supernatant solution, 120 g of methanol was added to the precipitated resin, and the resin was washed. Following the removal of the supernatant liquid, the resin was dried at 50° C. for 17 hrs to give a polymer (F-3) of the compounds (M-9) and (M-19) (amount of polymer: 20 g; yield: 67%). The polymer had an Mw of 5,900, the Mw/Mn of 1.40, and the content of fluorine atoms of 9.5% by mass.

Preparation of Radiation-Sensitive Resin Composition

Example 37

A radiation-sensitive resin composition (J-1) was prepared by mixing 100 parts by mass of the polymer (A-1) obtained in Synthesis Example 1, 10 parts by mass of the acid generating agent (B-1), 1,820 parts by mass of the organic solvent (C-1), 780 parts by mass of (C-2) and 30 parts by mass of (C-3), and 1.2 parts by mass of the acid diffusion control agent (D-1), and filtering the resultant mixed solution through a filter having a pore size of 0.20 μm.

Examples 38 to Example 70, and Comparative Example 1

Each of radiation-sensitive resin compositions (J-2) to (J-34) of Examples 38 to 70 and a radiation-sensitive resin composition (j-1) of Comparative Example 1 were prepared in a similar manner to Example 37 except that formulation of the blend was changed as shown in Tables 3-1 and 3-2.

TABLE 3-1

|  | Radiation-sensitive resin composition | (A) Polymer (parts by mass) | (B) Acid generating agent (parts by mass) | (C) Organic solvent (parts by mass) | (D) Acid diffusion control agent (parts by mass) | (F) Polymer (parts by mass) |
|---|---|---|---|---|---|---|
| Example 37 | J-1 | A-1(100) | B-1(10) | C-1 (1,820)/C-2 (780)/C-3 (30) | D-1(1.2) | — |
| Example 38 | J-2 | A-1(100) | B-1(10) | C-1 (1,820)/C-2 (780)/C-3 (30) | D-1(1.2) | F-1(5) |
| Example 39 | J-3 | A-2(100) | B-1(4)/B-5(6.5) | C-1 (1,820)/C-2 (780)/C-3 (30) | D-1(1.2) | F-2(5) |
| Example 40 | J-4 | A-3(100) | B-2(8) | C-1 (1,820)/C-2 (780)/C-3 (30) | D-1(1.2) | F-3(5) |
| Example 41 | J-5 | A-4(100) | B-8(12) | C-1 (1,820)/C-2 (780)/C-3 (30) | D-1(1.2) | — |

TABLE 3-1-continued

| | Radiation-sensitive resin composition | (A) Polymer (parts by mass) | (B) Acid generating agent (parts by mass) | (C) Organic solvent (parts by mass) | (D) Acid diffusion control agent (parts by mass) | (F) Polymer (parts by mass) |
|---|---|---|---|---|---|---|
| Example 42 | J-6 | A-4(100) | B-8(15) | C-1 (1,820)/C-2 (780)/C-3 (30) | D-1(1.2) | — |
| Example 43 | J-7 | A-5(100) | B-5(10) | C-1 (1,820)/C-2 (780)/C-3 (30) | D-1(1.2) | F-1(2)/F-3(3) |
| Example 44 | J-8 | A-6(100) | B-3(9) | C-1 (1,820)/C-2 (780)/C-3 (30) | D-2(0.9) | F-2(5) |
| Example 45 | J-9 | A-7(100) | B-7(12) | C-1 (1,820)/C-2 (780)/C-3 (30) | D-3(1.0) | — |
| Example 46 | J-10 | A-8(100) | B-6(7) | C-1 (1,820)/C-2 (780)/C-3 (30) | D-4(1.2) | — |
| Example 47 | J-11 | A-9(100) | B-1(10) | C-1 (1,820)/C-2 (780)/C-3 (30) | D-5(1.2) | — |
| Example 48 | J-12 | A-10(100) | B-4(7) | C-1 (1,820)/C-2 (780)/C-3 (30) | D-6(1.3) | — |
| Example 49 | J-13 | A-11(100) | B-5(12) | C-1 (1,820)/C-2 (780)/C-3 (30) | D-7(1.5) | — |
| Example 50 | J-14 | A-12(100) | B-2(12) | C-1 (1,820)/C-2 (780)/C-3 (30) | D-8(1.5) | F-3(5) |
| Example 51 | J-15 | A-13(100) | B-5(11) | C-1 (1,820)/C-2 (780)/C-3 (30) | D-2(1.2) | — |
| Example 52 | J-16 | A-14(100) | B-1(4)/B-2(5) | C-1 (1,820)/C-2 (780)/C-3 (30) | D-1(1.3) | — |
| Example 53 | J-17 | A-15(100) | B-2(5)/B-5(5) | C-1 (1,820)/C-2 (780)/C-3 (30) | D-2(1.2) | — |

TABLE 3-2

| | Radiation-sensitive resin composition | (A) Polymer (parts by mass) | (B) Acid generating agent (parts by mass) | (C) Organic solvent (parts by mass) | (D) Acid diffusion control agent (parts by mass) | (F) Polymer (parts by mass) |
|---|---|---|---|---|---|---|
| Example 54 | J-18 | A-16(100) | B-2(4)/B-5(8) | C-1(1,820)/C-2(780)/C-3(100) | D-1(1.2) | F-2(5) |
| Example 55 | J-19 | A-17(100) | B-2(4)/B-5(8) | C-1(1,820)/C-2(780)/C-3(100) | D-1(1.2) | F-2(5) |
| Example 56 | J-20 | A-18(100) | B-2(4)/B-5(8) | C-1(1,820)/C-2(780)/C-3(100) | D-1(1.2) | F-2(5) |
| Example 57 | J-21 | A-19(100) | B-5(12) | C-1(1,820)/C-2(780)/C-3(100) | D-7(1.5) | F-2(5) |
| Example 58 | J-22 | A-20(100) | B-5(12) | C-1(1,820)/C-2(780)/C-3(100) | D-7(1.5) | F-2(5) |
| Example 59 | J-23 | A-21(100) | B-5(12) | C-1(1,820)/C-2(780)/C-3(100) | D-7(1.5) | F-2(5) |
| Example 60 | J-24 | A-22(100) | B-5(12) | C-1(1,820)/C-2(780)/C-3(100) | D-7(1.5) | F-2(5) |
| Example 61 | J-25 | A-23(100) | B-1(10) | C-1 (1,820)/C-2 (780)/C-3 (30) | D-1(1.2) | — |
| Example 62 | J-26 | A-23(100) | B-1(10) | C-1 (1,820)/C-2 (780)/C-3 (30) | D-1(1.2) | F-1(5) |
| Example 63 | J-27 | A-24(100) | B-1(4)/B-5(6.5) | C-1 (1,820)/C-2 (780)/C-3 (30) | D-1(1.2) | — |
| Example 64 | J-28 | A-24(100) | B-1(4)/B-5(6.5) | C-1 (1,820)/C-2 (780)/C-3 (30) | D-1(1.2) | F-1(5) |
| Example 65 | J-29 | A-25(100) | B-8(15) | C-1 (1,820)/C-2 (780)/C-3 (30) | D-1(1.2) | F-1(3) |
| Example 66 | J-30 | A-26(100) | B-5(12) | C-1 (1,820)/C-2 (780)/C-3 (30) | D-1(1.2) | F-1(5) |
| Example 67 | J-31 | A-27(100) | B-3(10) | C-1 (1,820)/C-2 (780)/C-3 (30) | D-1(1.2) | — |
| Example 68 | J-32 | A-27(100) | B-3(10) | C-1 (1,820)/C-2 (780)/C-3 (30) | D-1(1.2) | F-1(5) |
| Example 69 | J-33 | A-28(100) | B-6(7) | C-1 (1,820)/C-2 (780)/C-3 (30) | D-1(1.2) | — |
| Example 70 | J-34 | A-28(100) | B-6(7) | C-1 (1,820)/C-2 (780)/C-3 (30) | D-1(1.2) | F-1(3) |
| Comparative Example 1 | j-1 | a-1(100) | B-1(10) | C-1 (1,820)/C-2 (780)/C-3 (30) | D-1(1.2) | — |

Evaluation

With regard to the obtained radiation-sensitive resin compositions (J-1) to (J-34) and radiation-sensitive resin composition (j-1), evaluations were made by forming a pattern using an ArF excimer laser as a light source in accordance the following each pattern-forming method.

Pattern-Forming Method (P-1)

On an 8-inch silicon wafer having an underlayer antireflective film ("ARC29A", manufactured by Nissan Chemical Industries, Ltd.) provided thereon, the radiation-sensitive resin composition was coated using a spin coater (CLEAN TRACK ACT8, manufactured by Tokyo Electron Limited), and thereafter subjected to soft baking (SB) at a temperature shown in Tables 3-1 and 3-2 for 60 sec to provide a coating film of the radiation-sensitive resin composition having a film thickness of 100 nm.

The resist coating film was subjected to ¼-reduced projection exposure using a full field stepper (trade name: NSR S306C, manufactured by Nikon Corporation) under a condition of illumination involving an NA of 0.78, an illumination NA of 0.70, a ratio of 0.66 and Annular through a halftone mask pattern with a line of 360 nm and a pitch of 720 nm. Then, after post-baking (PEB) was carried out at a temperature shown in Tables 3-1 and 3-2 for 60 sec, the resist coating film was developed with a 2.38% by mass aqueous tetramethylammonium hydroxide solution (hereinafter, may be also referred to as "aqueous TMAH solution") and washed with water, followed by drying to form a positive type resist pattern.

In accordance with this method, a minimum exposure dose that enabled a pattern having a line of 90 nm and a pitch of 180 nm to be resolved was defined as sensitivity (mJ/cm$^2$). It is to be noted that a scanning electron microscope ("S-9380", manufactured by Hitachi High-Technologies Corporation) was used for the measurement on the resist pattern. This pattern-forming method is designated as (P-1).

Pattern-Forming Method (P-2)

On a 12-inch silicon wafer having an underlayer antireflective film ("ARC66", manufactured by Nissan Chemical Industries, Ltd.) provided thereon, the radiation-sensitive resin composition was coated using a spin coater (CLEAN TRACK ACT12, manufactured by Tokyo Electron Limited), and thereafter subjected to soft baking (SB) at a temperature shown in Tables 3-1 and 3-2 for 60 sec to provide a coating film of the radiation-sensitive resin composition having a film thickness of 100 nm.

Furthermore, a liquid immersion upperlayer film ("TCX112", manufactured by JSR Corporation) was coated on the coating film of the radiation-sensitive resin composition using a coater developer (CLEAN TRACK Lithius, manufactured by Tokyo Electron Limited), and subjected to baking at 90° C. for 60 sec (TC Baking) to provide a coating film for evaluation. Next, this coating film for evaluation was subjected to ¼-reduced projection exposure using an ArF excimer laser immersion Scanner ("NSR S610C", manufactured by NIKON Corporation) under a condition of illumination involving an NA of 1.30, an illumination NA of 1.27, a ratio of 0.80 and Dipole through a halftone mask pattern with a line of 180 nm and a pitch of 360 nm. In this procedure, pure water was disposed as a liquid immersion solvent between the coating film for evaluation and a lens of a liquid immersion lithography system. After the exposure, each coating film for evaluation was subjected to post-baking (PEB) using a coater developer (CLEAN TRACK Lithius, manufactured by Tokyo Electron Limited) at a temperature shown in Tables 3-1 and 3-2 for 60 sec. Thereafter, the coating film was developed with a 2.38% by mass aqueous TMAH solution and washed with water, followed by drying to form a positive type resist pattern.

In accordance with this method, a minimum exposure dose that enabled a pattern having a line of 45 nm and a pitch of 90 nm to be resolved was defined as sensitivity (mJ/cm$^2$). It is to be noted that a scanning electron microscope ("CG-4000", manufactured by Hitachi High-Technologies Corporation) was used for the measurement on the resist pattern. This pattern-forming method is designated as (P-2).

Pattern-Forming Method (P-3)

On a 12-inch silicon wafer having an underlayer antireflective film ("ARC66", manufactured by Nissan Chemical Industries, Ltd.) provided thereon, a photoresist film having a film thickness of 100 nm was formed by a radiation-sensitive resin composition, and thereafter subjected to soft baking (SB) at a temperature shown in Tables 3-1 and 3-2 for 60 sec. Next, the photoresist film was exposed using the ArF excimer laser immersion Scanner under a condition involving an NA of 1.30, an illumination NA of 1.27, a ratio of 0.80 and Annular through a mask pattern. After the exposure, post-baking (PEB) was carried out at a temperature shown in Tables 3-1 and 3-2 for 60 sec. Thereafter, the photoresist film was developed with a 2.38% aqueous TMAH solution and washed with water, followed by drying to form a positive type resist pattern.

In accordance with this method, a minimum exposure dose that enabled a pattern having a line of 45 nm and a pitch of 90 nm to be resolved was defined as sensitivity (mJ/cm$^2$). It is to be noted that a scanning electron microscope ("CG-4000", Hitachi High-Technologies Corporation) was used for the measurement of the lengths. This pattern-forming method is designated as (P-3).

Pattern Configuration

In connection with pattern configuration, evaluation was made as "favorable" when a pattern having an intended size was resolved, and as "unfavorable" when the resolution failed according to these pattern-forming methods (P-1) to (P-3). The results are shown in Tables 4-1 and 4-2 along with the sensitivity.

Example 71

The radiation-sensitive resin composition (J-1) was used to from a pattern according to the pattern-forming method (P-1). When the coated film exposed was observed under a scanning electron microscope, successful formation of a line of 90 nm and a pitch of 180 nm was confirmed at an exposure dose of 53 mJ.

Examples 72 to 105

Patterns were formed using each radiation-sensitive resin composition at an SB temperature and a PEB temperature in accordance with and the pattern-forming method shown in Tables 4-1 and 4-2. The results are shown in Tables 4-1 and 4-2.

Comparative Example 2

When a coated film provided using the radiation-sensitive resin composition (j-1), followed by exposure according to the pattern-forming method (P-1) was observed under a scanning electron microscope, a contrast between the upper portion and the bottom portion of the pattern disappeared before a line of 90 nm was formed, thereby leading to failure in formation of the pattern before reading the exposure dose.

Comparative Example 3

When a coated film provided using the radiation-sensitive resin composition (j-1), followed by exposure according to the pattern-forming method (P-2) was observed under a scanning electron microscope, a contrast between the upper portion and the bottom portion of the pattern disappeared before a line of 45 nm was formed, thereby leading to failure in formation of the pattern before reading the exposure dose.

TABLE 4-1

| | Radiation-sensitive resin composition | SB (° C.) | PEB (° C.) | Pattern-forming method | | | | | |
|---|---|---|---|---|---|---|---|---|---|
| | | | | P-1 | | P-2 | | P-3 | |
| | | | | Sensitivity (mJ/cm$^2$) | Pattern shape | Sensitivity (mJ/cm$^2$) | Pattern shape | Sensitivity (mJ/cm$^2$) | Pattern shape |
| Example 71 | J-1 | 90 | 105 | 53 | favorable | 46 | favorable | — | — |
| Example 72 | J-2 | 90 | 105 | — | — | — | — | 47 | favorable |
| Example 73 | J-2 | 100 | 115 | — | — | — | — | 39 | favorable |
| Example 74 | J-3 | 90 | 115 | — | — | — | — | 34 | favorable |
| Example 75 | J-4 | 100 | 100 | — | — | — | — | 33 | favorable |
| Example 76 | J-5 | 100 | 105 | 38 | favorable | 33 | favorable | — | — |
| Example 77 | J-6 | 100 | 100 | 37 | favorable | 32 | favorable | — | — |
| Example 78 | J-7 | 90 | 100 | — | — | — | — | 32 | favorable |
| Example 79 | J-8 | 95 | 105 | — | — | — | — | 41 | favorable |
| Example 80 | J-9 | 100 | 100 | 51 | favorable | 44 | favorable | — | — |
| Example 81 | J-10 | 110 | 110 | 46 | favorable | 40 | favorable | — | — |
| Example 82 | J-11 | 100 | 95 | 37 | favorable | 32 | favorable | — | — |
| Example 83 | J-12 | 110 | 110 | 46 | favorable | 40 | favorable | — | — |

TABLE 4-1-continued

| | Radiation-sensitive resin composition | SB (° C.) | PEB (° C.) | Pattern-forming method | | | | | |
|---|---|---|---|---|---|---|---|---|---|
| | | | | P-1 | | P-2 | | P-3 | |
| | | | | Sensitivity (mJ/cm²) | Pattern shape | Sensitivity (mJ/cm²) | Pattern shape | Sensitivity (mJ/cm²) | Pattern shape |
| Example 84 | J-13 | 105 | 105 | 41 | favorable | 36 | favorable | — | — |
| Example 85 | J-14 | 90 | 100 | — | — | — | — | 41 | favorable |
| Example 86 | J-15 | 80 | 80 | 60 | favorable | 52 | favorable | — | — |
| Example 87 | J-16 | 80 | 90 | 54 | favorable | 47 | favorable | — | — |
| Example 88 | J-17 | 85 | 85 | 44 | favorable | 38 | favorable | — | — |
| Example 89 | J-18 | 100 | 95 | — | — | — | — | 37 | favorable |
| Example 90 | J-19 | 100 | 95 | — | — | — | — | 32 | favorable |

TABLE 4-2

| | Radiation-sensitive resin composition | SB (° C.) | PEB (° C.) | Pattern-forming method | | | | | |
|---|---|---|---|---|---|---|---|---|---|
| | | | | P-1 | | P-2 | | P-3 | |
| | | | | Sensitivity (mJ/cm²) | Pattern shape | Sensitivity (mJ/cm²) | Pattern shape | Sensitivity (mJ/cm²) | Pattern shape |
| Example 91 | J-20 | 100 | 95 | — | — | — | — | 35 | favorable |
| Example 92 | J-21 | 100 | 95 | — | — | — | — | 22 | favorable |
| Example 93 | J-22 | 100 | 95 | — | — | — | — | 21 | favorable |
| Example 94 | J-23 | 100 | 95 | — | — | — | — | 37 | favorable |
| Example 95 | J-24 | 100 | 95 | — | — | — | — | 23 | favorable |
| Example 96 | J-25 | 100 | 115 | 37 | favorable | 35 | favorable | — | — |
| Example 97 | J-26 | 100 | 115 | — | — | — | — | 37 | favorable |
| Example 98 | J-21 | 95 | 100 | 42 | favorable | 40 | favorable | — | — |
| Example 99 | J-28 | 95 | 100 | — | — | — | — | 42 | favorable |
| Example 100 | J-29 | 100 | 100 | — | — | — | — | 46 | favorable |
| Example 101 | J-30 | 100 | 120 | — | — | — | — | 33 | favorable |
| Example 102 | J-31 | 110 | 100 | 48 | favorable | 44 | favorable | — | — |
| Example 103 | J-32 | 100 | 100 | — | — | — | — | 45 | favorable |
| Example 104 | J-33 | 95 | 105 | 51 | favorable | 44 | favorable | — | — |
| Example 105 | J-34 | 95 | 105 | — | — | — | — | 45 | favorable |
| Comparative Example 2 | j-1 | 90 | 105 | — | unfavorable | — | unfavorable | — | — |
| Comparative Example 3 | j-1 | 90 | 120 | — | unfavorable | — | unfavorable | — | — |

As shown in Tables 4-1 and 4-2, it is revealed that the radiation-sensitive resin composition is superior in resolving performances, and can form a fine pattern configuration according to the embodiment of the present invention.

The radiation-sensitive resin composition according to the embodiment of the present invention is superior in sensitivity and resolving performances, and thus can be suitably used as a photoresist material. In addition, the composition can be suitably used also in liquid immersion lithography processes, and the like.

Obviously, numerous modifications and variations of the present invention are possible in light of the above teachings. It is therefore to be understood that within the scope of the appended claims, the invention may be practiced otherwise than as specifically described herein.

The invention claimed is:

1. A radiation-sensitive resin composition comprising:
a first polymer comprising a first structural unit derived from a compound represented by formula (1) or formula (1-47), and a second structural unit derived from a compound represented by formula (2);
an acid generating agent; and
an organic solvent,

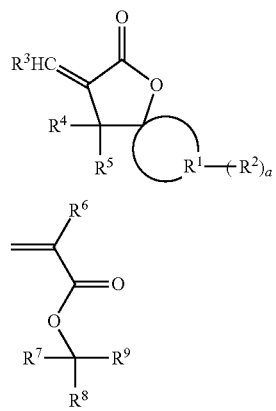

(1)

(2)

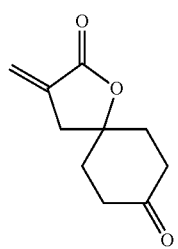

(1-47)

wherein, in the formula (1), $R^1$ represents an organic group having a valency of (a+2) that represents a ring structure having 3 to 8 carbon atoms together with the carbon atom constituting the lactone ring;

$R^2$ represents a fluorine atom, a hydroxyl group, a chain hydrocarbon group having 1 to 20 carbon atoms, an alkoxy group having 1 to 5 carbon atoms, a methoxy carbonyl group, an ethoxy carbonyl group, an oxacycloalkyloxy group having 2 to 10 carbon atoms, or —R'—X—R", a part or all of hydrogen atoms of the chain hydrocarbon group having 1 to 20 carbon atoms optionally being substituted with a halogen atom, a cyano group, a carboxyl group, a hydroxyl group or a thiol group, wherein R' represents a single bond or a hydrocarbon group having 1 to 10 carbon atoms, R" represents an alkylsilyl group having 1 to 20 carbon atoms, and X represents —O— or —NH—, and wherein at least one group of $R^1$ and $R^2$ has a hetero atom or a halogen atom;

a is an integer of 1 to 6, wherein in a case where a is 2 or greater, each $R^2$ is identical or different, and at least two $R^e$s optionally taken together represent a ring structure;

$R^3$ represents a hydrogen atom or a methyl group;

$R^4$ represents a hydrogen atom, a fluorine atom, or an alkyl group having 1 to 6 carbon atoms; and $R^5$ represents a hydrogen atom, or $R^5$ and $R^4$ taken together represent a cycloalkanediyl group having 3 to 8 carbon atoms together with the carbon atom to which $R^5$ and $R^4$ bond, and in the formula (2), $R^6$ represents a hydrogen atom or a methyl group;

$R^7$, $R^8$ and $R^9$ each independently represent an alkyl group having 1 to 6 carbon atoms, or $R^7$ and $R^8$ taken together represent a ring structure together with the carbon atom to which $R^7$ and $R^8$ bond and $R^9$ represents an alkyl group having 1 to 6 carbon atoms, wherein a hydrogen atom of the alkyl group represented by $R^7$, $R^8$ or $R^9$ is not substituted or substituted.

2. The radiation-sensitive resin composition according to claim 1, wherein at least one group of $R^1$ and $R^2$ in the formula (1) comprises an oxygen atom.

3. The radiation-sensitive resin composition according to claim 1, wherein $R^1$ in the formula (1) represents a chain hydrocarbon group having a valency of (a+2) that includes one or more of —CO—, —COO—, —OCO—, —O—, —NR—, —S—, —SO—, and —SO$_2$ in a skeleton chain, wherein R represents a hydrogen atom or an organic group having 1 to 20 carbon atoms.

4. The radiation-sensitive resin composition according to claim 1, wherein "a" in the formula (1) is 1.

5. The radiation-sensitive resin composition according to claim 1, wherein the compound represented by the formula (2) is represented by formula (2a) or formula (2b):

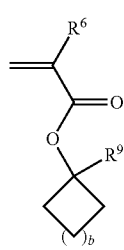

(2a)

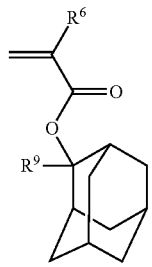

(2b)

wherein, in the formula (2a) and the formula (2b), $R^6$ and $R^9$ are as defined in the formula (2), and b is an integer of 1 to 5.

6. The radiation-sensitive resin composition according to claim 1, wherein $R^2$ in the formula (1) represents a fluorine atom, a hydroxyl group, a chain hydrocarbon group having 1 to 5 carbon atoms, a methoxy carbonyl group, an ethoxy carbonyl group, or an oxacycloalkyloxy group having 2 to 10 carbon atoms, and wherein in a case where a is 2 or greater, each $R^2$ is identical or different, and at least two $R^2$s optionally taken together represent a ring structure.

7. The radiation-sensitive resin composition according to claim 1, wherein a content of the first structural unit in the first polymer with respect to entire structural units constituting the first polymer is no less than 5 mol % and no greater than 70 mol %.

8. The radiation-sensitive resin composition according to claim 1, wherein a content of the first structural unit in the first polymer with respect to entire structural units constituting the first polymer is no less than 5 mol % and no greater than 50 mol %.

9. The radiation-sensitive resin composition according to claim 1, wherein in the formula (1), the alkylsilyl group represented by R" is a trimethylsilyl group or a tert-butyldimethylsilyl group.

10. The radiation-sensitive resin composition according to claim 1, further comprising a fluorine-containing polymer comprising a fluorine atom.

11. The radiation-sensitive resin composition according to claim 10, wherein an amount of the fluorine-containing polymer in the radiation-sensitive resin composition is 0.1 parts by mass to 20 parts by mass with respect to 100 parts by mass of the first polymer.

12. The radiation-sensitive resin composition according to claim 10, wherein an amount of the fluorine-containing polymer in the radiation-sensitive resin composition is 1 part by mass to 10 parts by mass with respect to 100 parts by mass of the first polymer.

13. The radiation-sensitive resin composition according to claim 10, wherein an amount of the fluorine-containing polymer in the radiation-sensitive resin composition is 1 part by mass to 7.5 parts by mass with respect to 100 parts by mass of the first polymer.

14. The radiation-sensitive resin composition according to claim 10, wherein a proportion of the fluorine atom in the fluorine-containing polymer is greater than a proportion of a fluorine atom in the first polymer.

15. The radiation-sensitive resin composition according to claim 10, wherein a proportion of the fluorine atom in the fluorine-containing polymer is from 5% by mass to 50% by mass.

16. The radiation-sensitive resin composition according to claim 10, wherein a proportion of the fluorine atom in the fluorine-containing polymer is from 5% by mass to 45% by mass.

17. The radiation-sensitive resin composition according to claim 1, further comprising an acid diffusion control agent.

18. The radiation-sensitive resin composition according to claim 17, an amount of the acid diffusion control agent in the radiation-sensitive resin composition is from 0.1 parts by mass to 8 parts by mass with respect to 100 parts by mass of the first polymer.

19. The radiation-sensitive resin composition according to claim 1, wherein $R^1$ represents a monocyclic alicyclic structure together with the carbon atom constituting the lactone ring.

* * * * *

UNITED STATES PATENT AND TRADEMARK OFFICE
CERTIFICATE OF CORRECTION

PATENT NO. : 9,459,532 B2  
APPLICATION NO. : 13/853254  
DATED : October 4, 2016  
INVENTOR(S) : Norihiko Ikeda et al.

Page 1 of 1

It is certified that error appears in the above-identified patent and that said Letters Patent is hereby corrected as shown below:

In the Claims

Column 71, Line 24, Claim 1, "and at least two $R^e$s" should read -- and at least two $R^2$s --.

Signed and Sealed this  
Twenty-seventh Day of March, 2018

Andrei Iancu  
*Director of the United States Patent and Trademark Office*